US011778853B2

(12) United States Patent
Liu et al.

(10) Patent No.: US 11,778,853 B2
(45) Date of Patent: *Oct. 3, 2023

(54) DISPLAY PANEL COMPRISING AN ENCAPSULATION LAYER, DISPLAY DEVICE, AND MANUFACTURING METHODS THEREOF

(71) Applicants: Chengdu BOE Optoelectronics Technology Co., Ltd., Chengdu (CN); BOE TECHNOLOGY GROUP CO., LTD., Beijing (CN)

(72) Inventors: Ying Liu, Beijing (CN); Ming Mao, Beijing (CN); Yuhang Peng, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/660,200

(22) Filed: Apr. 21, 2022

(65) Prior Publication Data
US 2022/0246885 A1    Aug. 4, 2022

Related U.S. Application Data

(63) Continuation of application No. 16/605,202, filed as application No. PCT/CN2019/081285 on Apr. 3, 2019, now Pat. No. 11,342,532.

(30) Foreign Application Priority Data

Nov. 1, 2018    (CN) .......................... 201811295601.4

(51) Int. Cl.
H10K 50/844    (2023.01)
H10K 50/80     (2023.01)
(Continued)

(52) U.S. Cl.
CPC ......... *H10K 50/844* (2023.02); *H10K 50/868* (2023.02); *H10K 59/40* (2023.02); *H10K 71/00* (2023.02); *H10K 77/111* (2023.02)

(58) Field of Classification Search
None
See application file for complete search history.

(56) References Cited

U.S. PATENT DOCUMENTS 6,614,122 B1    9/2003  Dory et al.
9,923,167 B2    3/2018  Choi et al.
(Continued)

FOREIGN PATENT DOCUMENTS

CN    104538566 A    4/2015
CN    106601781 A    4/2017
(Continued)

OTHER PUBLICATIONS

ISA National Intellectual Property Administration of the People's Republic of China, International Search Report Issued in Application No. PCT/CN2019/081285, dated Aug. 2, 2019, WIPO, 5 pages.

(Continued)

*Primary Examiner* — J. E. Schoenholtz
(74) *Attorney, Agent, or Firm* — McCoy Russell LLP

(57) ABSTRACT

A display panel and manufacturing methods thereof are provided. In one example, the display panel includes a flexible substrate having a display area and a non-display area, a dam structure located in the non-display area and disposed around the display area, one or more grooves disposed on the non-display area between the display area and the dam structure, and an organic encapsulation layer. In some examples, the organic encapsulation layer covers each of the display area, at least a portion of the non-display area, and the one or more grooves. Accordingly, a display device comprising the display panel is also provided. Thus, a (Continued)

flatness of the organic encapsulation layer may be improved and peeling may be reduced between the organic encapsulation layer and a substrate on which the organic encapsulation layer is disposed, thereby improving an overall quality of the finished display panel.

20 Claims, 20 Drawing Sheets

(51) Int. Cl.
    *H10K 59/40*     (2023.01)
    *H10K 71/00*     (2023.01)
    *H10K 77/10*     (2023.01)

(56) References Cited

U.S. PATENT DOCUMENTS

| | | | |
|---|---|---|---|
| 10,629,845 | B2 | 4/2020 | Kim et al. |
| 11,264,587 | B2 * | 3/2022 | Choi ............... H01L 27/124 |
| 11,342,532 | B2 * | 5/2022 | Liu ............... H01L 51/5253 |
| 2014/0217383 | A1 | 8/2014 | Park et al. |
| 2017/0256594 | A1 | 9/2017 | Bae et al. |
| 2018/0033998 | A1 | 2/2018 | Kim et al. |
| 2018/0061910 | A1 * | 3/2018 | Cai ............... H01L 51/56 |
| 2018/0166507 | A1 | 6/2018 | Hwang et al. |
| 2018/0254431 | A1 | 9/2018 | Kim |
| 2020/0075700 | A1 | 3/2020 | Cao et al. |
| 2020/0127216 | A1 | 4/2020 | Tao |

FOREIGN PATENT DOCUMENTS

| | | |
|---|---|---|
| CN | 107068715 A | 8/2017 |
| CN | 107329630 A | 11/2017 |
| CN | 206650080 U | 11/2017 |
| CN | 107507931 A | 12/2017 |
| CN | 206893618 U | 1/2018 |
| CN | 207441754 U | 6/2018 |
| CN | 108258146 A | 7/2018 |
| CN | 108279810 A | 7/2018 |
| CN | 109065577 A | 12/2018 |
| CN | 109244261 A | 1/2019 |
| CN | 109256487 A | 1/2019 |
| CN | 109300910 A | 2/2019 |
| CN | 109461832 A | 3/2019 |
| CN | 109494240 A | 3/2019 |
| JP | 2018097869 A | 6/2018 |
| JP | 2018113104 A | 7/2018 |
| JP | 2018124816 A | 8/2018 |
| JP | 2018530032 A | 10/2018 |
| WO | 2017116892 A1 | 7/2017 |
| WO | 2018179035 A1 | 10/2018 |

OTHER PUBLICATIONS

ISA National Intellectual Property Administration of the People's Republic of China, Written Opinion of the International Searching Authority Issued in Application No. PCT/CN2019/081285, dated Aug. 2, 2019, WIPO, 7 pages.
Japanese Patent Office, Decision to Grant Patent Issued in Application No. 2020-569167, dated Jul. 11, 2023, 6 pages.

* cited by examiner

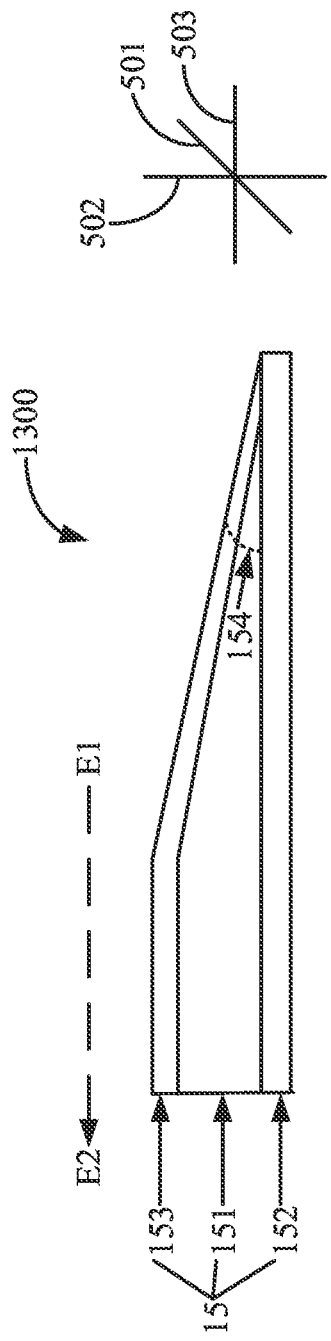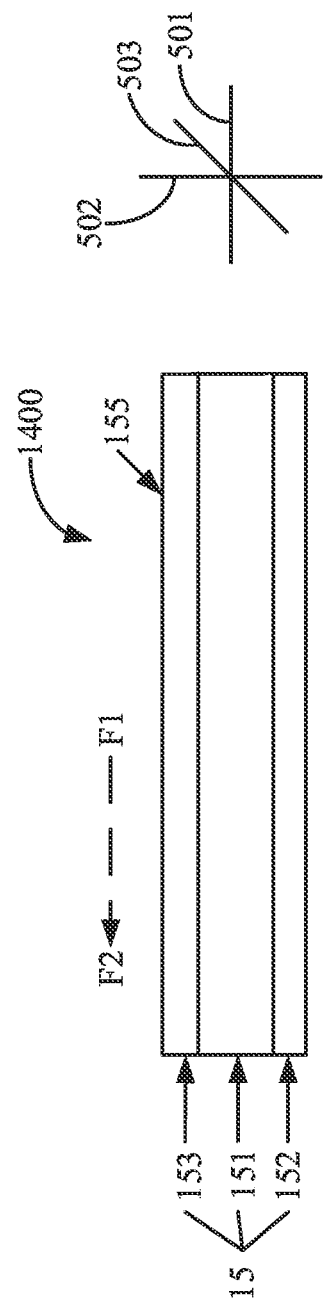

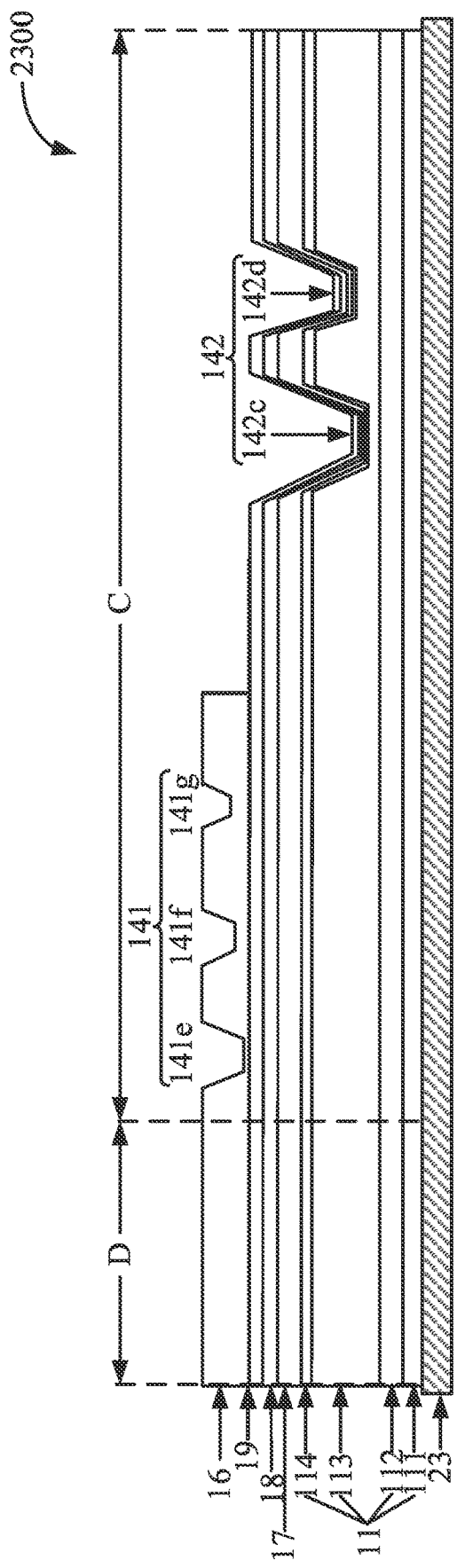
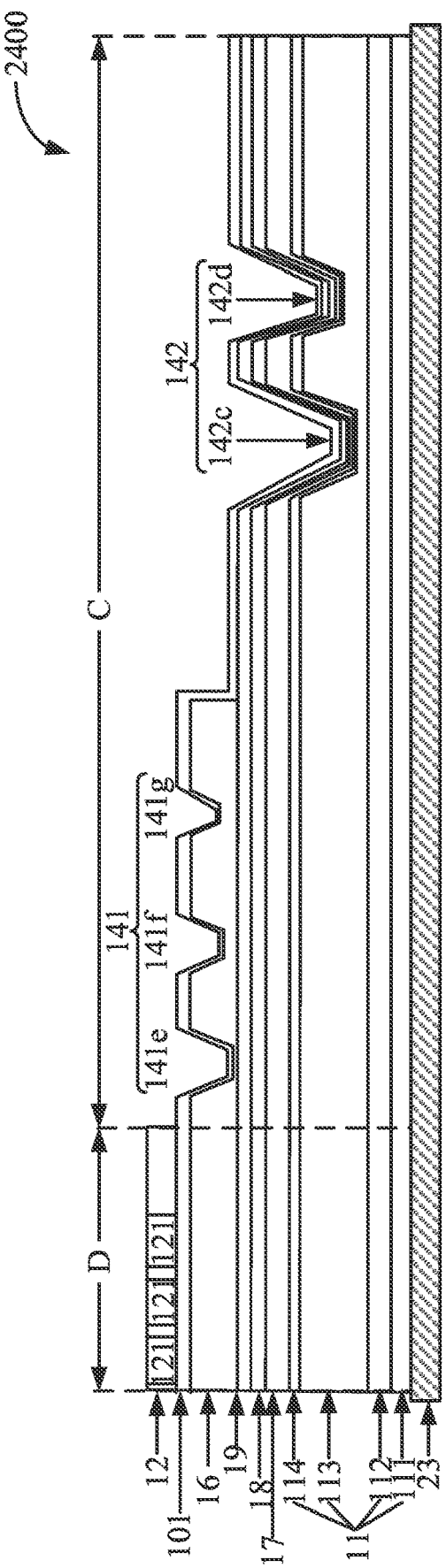
FIG. 23
FIG. 24

DISPLAY PANEL COMPRISING AN ENCAPSULATION LAYER, DISPLAY DEVICE, AND MANUFACTURING METHODS THEREOF

CROSS-REFERENCE TO RELATED APPLICATIONS

The present application is continuation of U.S. Non-Provisional patent application Ser. No. 16/605,202, entitled "DISPLAY PANEL, DISPLAY DEVICE, AND MANUFACTURING METHODS THEREOF", and filed on Oct. 14, 2019. U.S. Non-Provisional patent application Ser. No. 16/605,202 is a U.S. National Phase of International Patent Application No. PCT/CN2019/081285 entitled "DISPLAY PANEL, MANUFACTURING METHOD THEREOF AND DISPLAY DEVICE," filed on Apr. 3, 2019. International Patent Application No. PCT/CN2019/081285 claims priority to Chinese Patent Application No. 201811295601.4 filed on Nov. 1, 2018. The entire contents of each of the above-listed applications are hereby incorporated by reference for all purposes.

TECHNICAL FIELD

The present description relates generally to the field of display technologies, and embodiments of a display panel, a display device, and manufacturing methods thereof.

BACKGROUND

Flexible display devices have recently become a commercially viable and promising avenue of research in the field of display technologies, possessing desirable features such as bendability, versatility, and economy of space. Flexible display devices are characterized by a specialized display panel protected by a transparent cover.

SUMMARY

The present disclosure aims to solve or alleviate at least some of the issues existing in the prior art. As described herein, embodiments of a display panel, display device, and manufacturing methods thereof are proposed which may improve flatness of an organic encapsulation layer and reduce peeling between the organic encapsulation layer and a substrate on which it is disposed, thereby improving an overall quality of the finished display panel incorporating the organic encapsulation layer and the substrate.

An embodiment of the present disclosure provides a display panel, comprising a flexible substrate having a display area and a non-display area, a dam structure, located in the non-display area and disposed around the display area, one or more grooves disposed on the non-display area between the display area and the dam structure, and an organic encapsulation layer covering the display area, at least a portion of the non-display area, and the one or more grooves.

Another embodiment of the present disclosure provides a display device, comprising the display panel and a transparent cover, wherein the transparent cover is in face-sharing contact with the display panel.

Yet another embodiment of the present disclosure provides a method of manufacturing a display panel, the method comprising forming a flexible substrate on a rigid substrate, the flexible substrate having a display area and a non-display area, forming a dam structure in the non-display area and around the display area, forming one or more grooves on the non-display area between the display area and the dam structure, forming an organic encapsulation layer on the flexible substrate, and peeling off the rigid substrate, wherein the organic encapsulation layer covers the display area, at least a portion of the non-display area, and the one or more grooves.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure. Additionally, the summary above does not constitute an admission that the technical problems and challenges discussed were known to anyone other than the inventors.

BRIEF DESCRIPTION OF THE DRAWINGS

FIG. 13 shows a first cross-sectional view of an encapsulation layer of the display panel of FIG. 12.

FIG. 14 shows a second cross-sectional view of the encapsulation layer of the display panel of FIG. 12.

FIG. 23 shows a schematic structural diagram of a third example step of the manufacturing process of the display panel.

FIG. 24 shows a schematic structural diagram of a fourth example step of the manufacturing process of the display panel.

DETAILED DESCRIPTION

The following description relates to a display panel, a display device having the display panel, and manufacturing methods thereof. The specific embodiments of the present invention will be described in detail below with reference to the accompanying figures. It is to be understood that the specific embodiments described herein are merely illustrative and not restrictive.

Related flexible display devices include a transparent cover disposed on a display panel, wherein the display panel is packaged by a thin-film encapsulation (TFE) process during a manufacture thereof. As such, the display panel includes a flexible substrate, a display functional film layer, and an encapsulation layer, wherein the encapsulation layer includes an organic encapsulation layer and an inorganic encapsulation layer in a staggered arrangement. The encapsulation layer is typically formed by way of an encapsulation process such as the aforementioned TFE process, which alternately forms organic thin films and inorganic films to obtain the encapsulation layer. During formation of the organic portions of the encapsulation layer, organic material is liable to have a non-uniform thickness, or level difference, as a result of a leveling process. Peeling may therefore occur between the formed organic encapsulation layer and a substrate on which the organic encapsulation layer is disposed.

Figure 1:
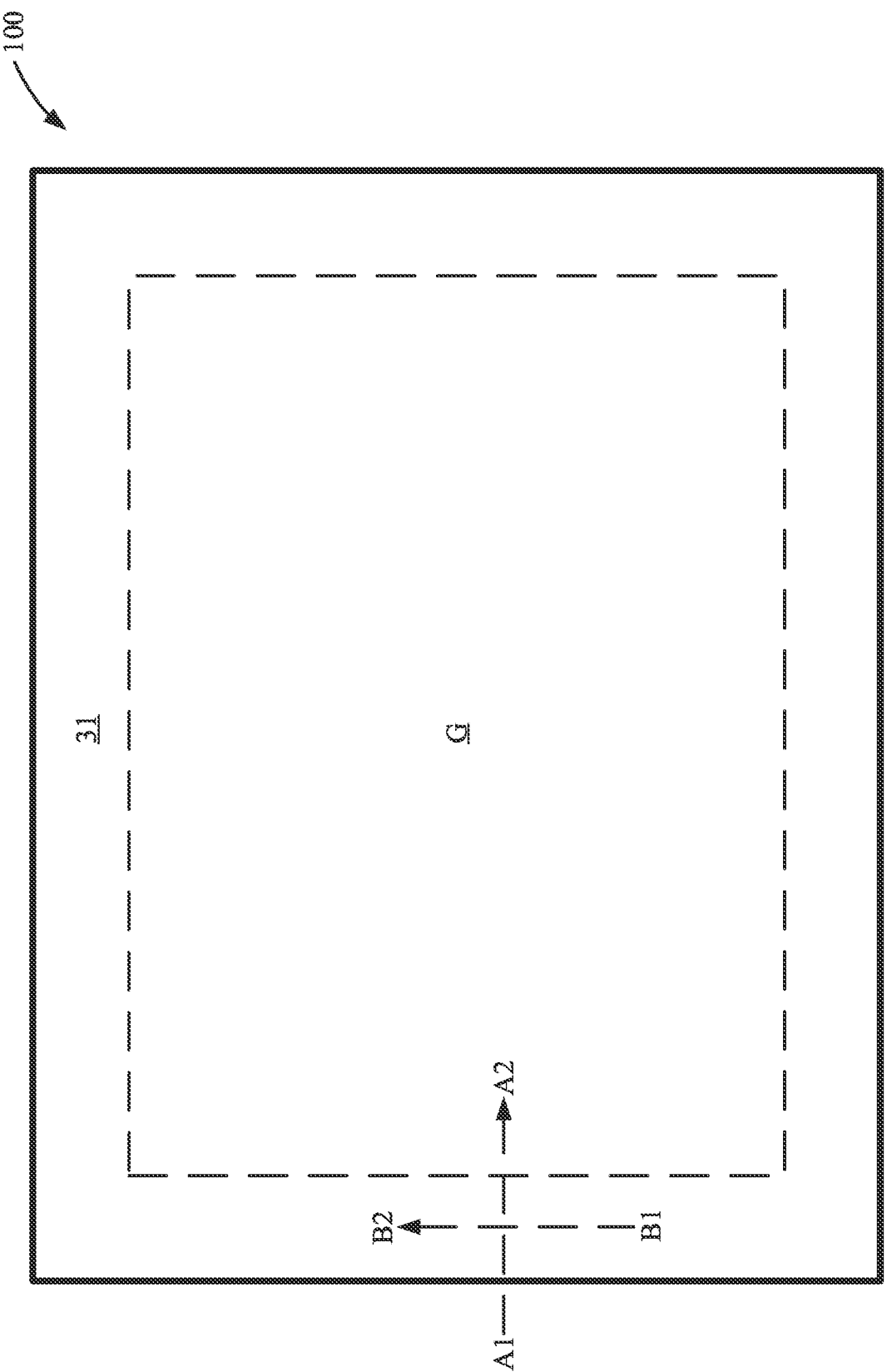
FIG. 1 shows a top view of an encapsulation layer on a related display panel.

Referring to FIG. 1, a top view 100 is depicted of an encapsulation layer 31 formed on a related display panel by way of a TFE process. A dashed line delimits a display area G of the related display panel. Lines A1-A2 and B1-B2 define axes for first cross-sectional view 200 and second cross-sectional view 300, respectively, depicted by FIGS. 2 and 3, respectively.

Figure 2:
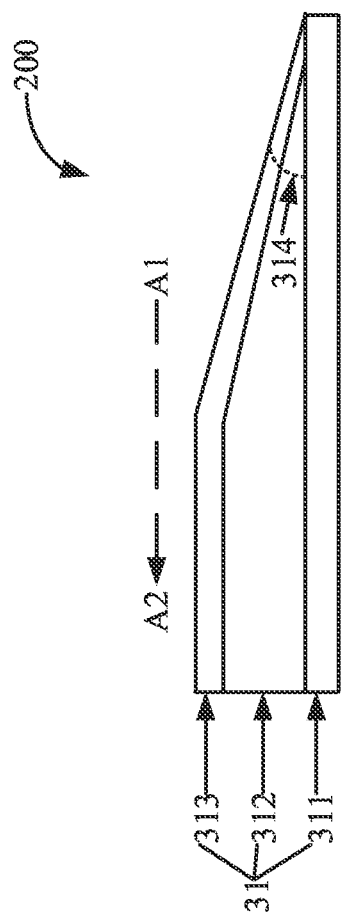
FIG. 2 shows a first cross-sectional view of the encapsulation layer of FIG. 1.
Figure 3:
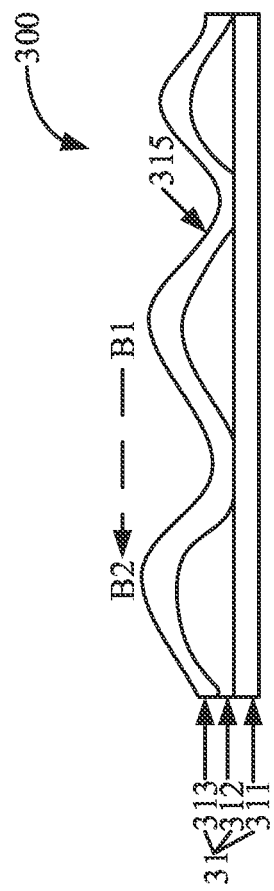
FIG. 3 shows a second cross-sectional view of the encapsulation layer of FIG. 1.

Referring to FIGS. 2 and 3, the encapsulation layer 31 includes a first inorganic encapsulation layer 311, an organic encapsulation layer 312, and a second inorganic encapsulation layer 313 which are sequentially stacked. As is apparent from FIGS. 2 and 3, due to a non-uniform thickness, or level difference, of an organic material during a manufacturing process of the encapsulation layer 31, the organic encapsulation layer 312 has a sawtooth structure, resulting in a lower flatness 315 of the entire encapsulation layer 31.

Figure 4:
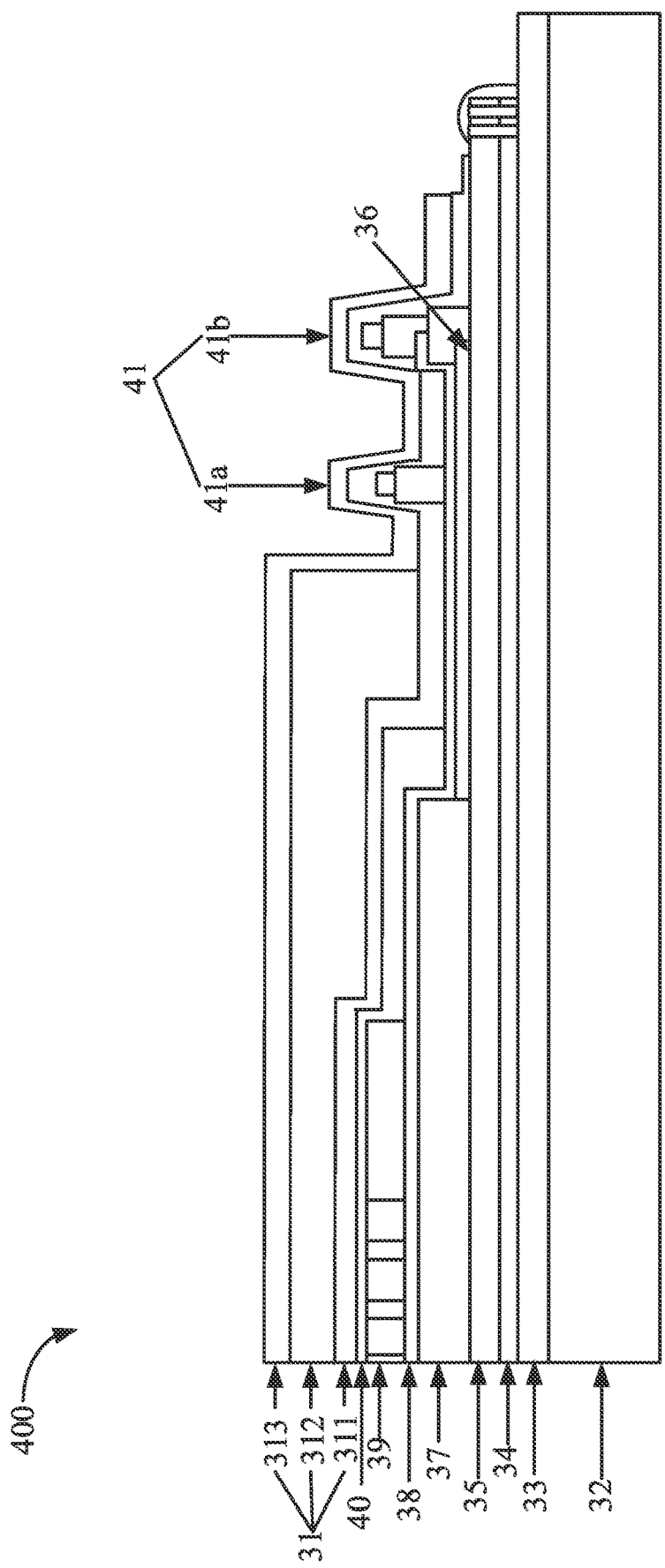
FIG. 4 shows a schematic structural diagram of the related display panel of FIG. 1.

Referring to FIG. 4, a schematic structural diagram 400 of the related display panel is depicted. As shown, the related display panel includes the encapsulation layer 31, a flexible substrate 32, a buffer layer 33, a first wire layer 34, an insulating layer 35, a second wire layer 36, a flat, or planarization, layer 37, a third wire layer 38, a display structure layer 39, a second flat, or planarization, layer 40, and a dam structure 41. In some examples, the dam structure 41 may further include a first dam substructure 41a and a second dam substructure 41b. As described with reference to FIGS. 2 and 3, the encapsulation layer 31 further includes the first inorganic encapsulation layer 311, the organic encapsulation layer 312, and the second inorganic encapsulation layer 313. Since the contact area between the organic encapsulation layer 312 and a given substrate (e.g., the second inorganic encapsulation layer 313) is relatively small, peeling between the two may result, which may further affect an overall quality of the related display panel.

In current applications, the encapsulation layer typically includes a first inorganic encapsulation layer, an organic encapsulation layer, and a second inorganic encapsulation layer. During the encapsulation process, organic material used to form the organic encapsulation layer is leveled in a non-display area of the display panel (in this context, "leveling" refers to the effect of surface tension on the flow speed of the organic material after the organic material is coated, but before the organic material has been dried into a film). The leveling process results in non-uniform thickness of the organic encapsulation layer, that is, the formed organic encapsulation layer may not be flat enough, resulting in low display brightness uniformity of the finished display panel. Simultaneously, since the contact area of the formed organic encapsulation layer with the substrate on which it is disposed is relatively small, peeling occurs between the organic encapsulation layer and the substrate, which may further affect the quality of the finished display panel. As an example, the substrate on which the organic encapsulation layer is disposed may be a film layer located between the organic encapsulation layer and the flexible substrate, and in contact with the organic encapsulation layer.

Figure 5:
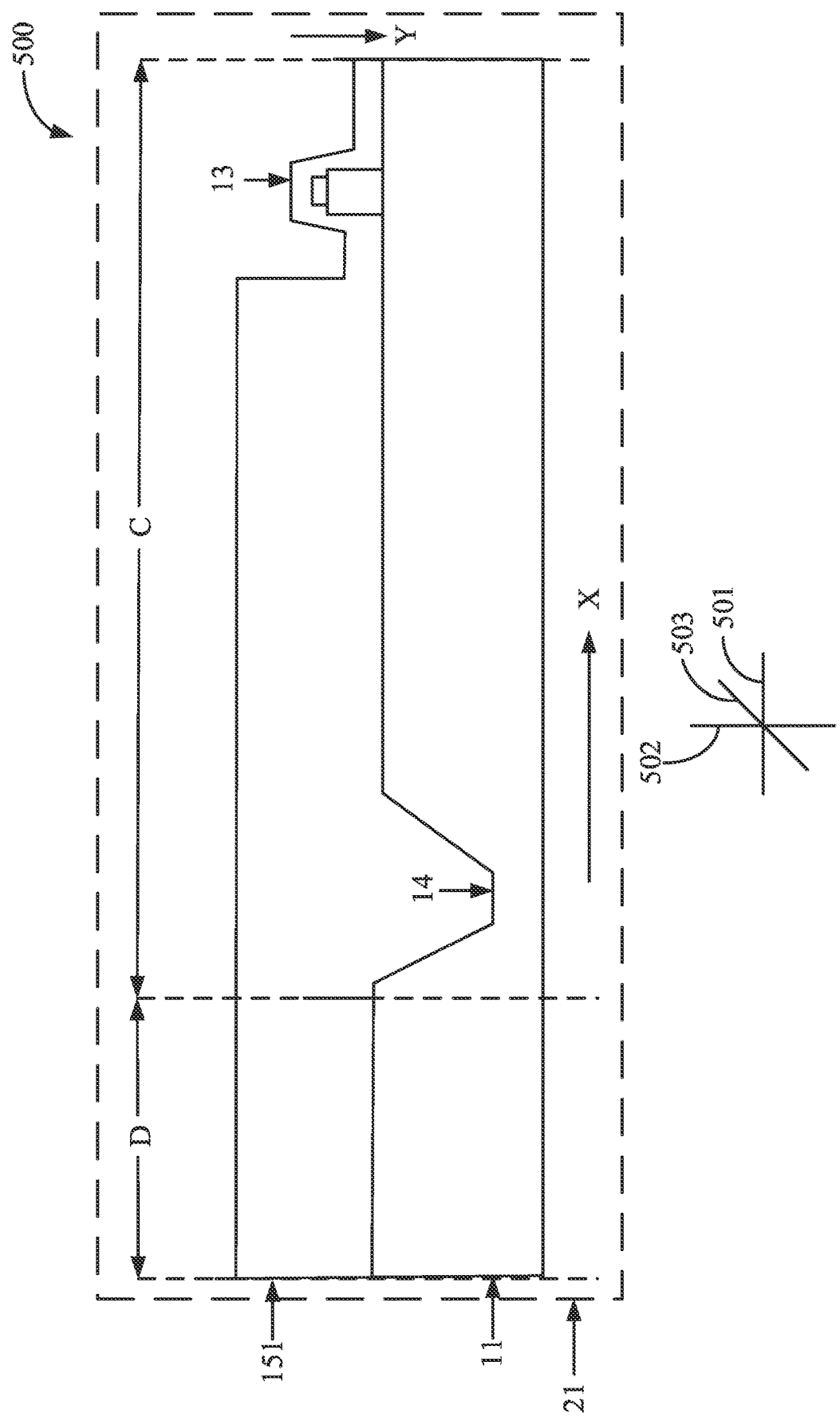
FIG. 5 shows a schematic structural diagram of a first example of a display panel according to an embodiment of the present disclosure.

As such, and as will be described below with reference to FIGS. 5-14, a display panel is provided by an embodiment of the present disclosure. Referring now to FIG. 5, a schematic structural diagram 500 of a first example of a display panel 21 is depicted. Mutually perpendicular axes 501, 502, and 503 define a three-dimensional space for the diagram 500, where the axis 501 and the axis 502 define a plane of FIG. 5 and the axis 503 is normal to the plane of FIG. 5. It will be appreciated that FIGS. 6-11, 14-17, and 21-24 (described in more detail below) are depicted in the same plane as FIG. 5. FIGS. 12 and 13 (described in more detail below) are depicted in planes which are mutually perpendicular to one another and to the plane of FIGS. 5-11, 14-17, and 21-24. Further a direction X may be parallel with the axis 501 and a direction Y may be parallel with the axis 502.

The display panel 21 includes a flexible substrate 11 having a display area, or effective display area, or active area, D and a non-display area C. The non-display area C may be an annular area fitting to a perimeter, or shape, of the display area D and thereby encompassing the display area D. Each of the display area D and the non-display area C is in a plane defined by the axes 501 and 503 (that is, perpendicular to the plane of FIG. 5). As an example, the shape of the display area D may be a rectangle and a shape of the non-display area C may be an annular rectangle. As another example, the shape of the display area D may be a circle and the shape of the non-display area C may be an annular circle, or ring. The non-display area C may further include a first annular region, or outgas region, C1 and a second annular region C2.

The display panel 21 further includes a dam structure 13, one or more grooves 14, and an organic encapsulation layer 151. The dam structure 13 is located in the non-display area C and disposed around, for example, outside the perimeter of, the display area D. The one or more grooves 14 are disposed on the non-display area C between the display area D and the dam structure 13. The organic encapsulation layer 151 covers each of the display area D, at least a portion of the non-display area C, and the one or more grooves 14. The organic encapsulation layer 151 may be made of a polyimide material, for example.

In some examples, the one or more grooves 14 are already formed when the organic encapsulation layer 151 is formed. During a manufacturing process of the organic encapsulation layer 151, organic material may be drained via the one or more grooves 14 to improve a flatness of the organic encapsulation layer 151. As such, a contact area of the organic encapsulation layer 151 with a substrate disposed thereon may be increased, thereby reducing peeling between the organic encapsulation layer 151 and the substrate disposed thereon, and improving an overall quality of the display panel 21.

Figure 6:
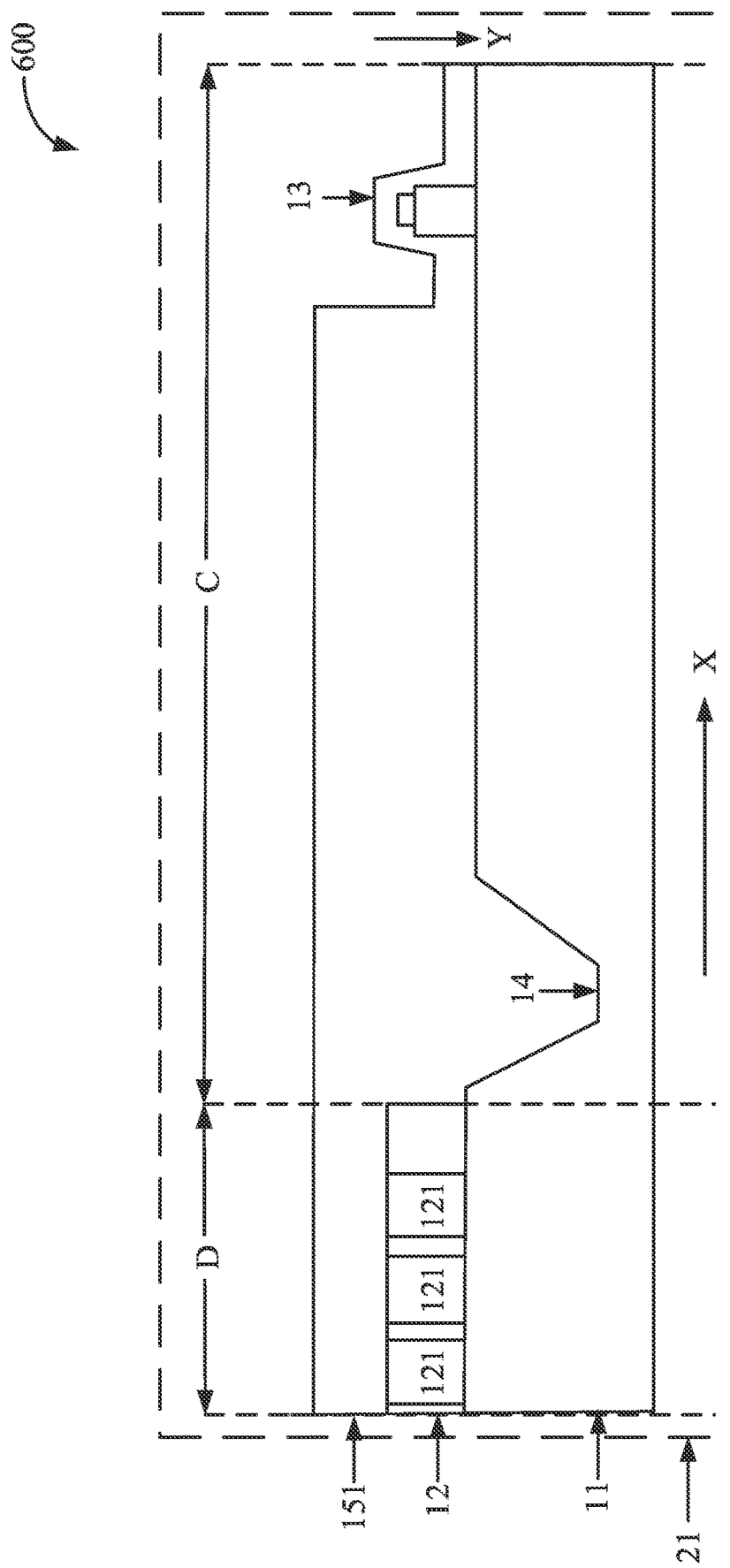
FIG. 6 shows a schematic structural diagram of a second example of the display panel.

Referring now to FIG. 6, a schematic structural diagram 600 of a second example of the display panel 21 is depicted. The display panel 21 may further include a display structure layer, or organic display structure layer, 12, which is located on the display area D of the flexible substrate 11. For example, the organic display structure layer 12 may include a plurality of organic light-emitting devices 121, wherein each of the organic light-emitting devices 121 includes a first pole or electrode, a light-emitting layer, and a second pole or electrode. In some examples, each of the organic light-emitting devices 121 includes a first pole anode and a second pole cathode. In some examples, each of the organic light-emitting devices 121 includes a first pole cathode and a second pole anode. In some examples, each of the organic light-emitting devices 121 further includes a hole injection layer (HIL) and a hole transport layer (HTL) located between the anode and the light-emitting layer, and an electron transport layer (ETL) and an electron injection layer (EIL) located between the cathode and the light-emitting layer. Each of the organic light-emitting devices 121 is used to emit light of one color, for example, red, green, or blue. In some examples, the organic display structure layer 12 further includes a pixel definition layer, where the pixel definition layer is used to define an area of a pixel in the display panel.

As an example, the organic display structure layer 121 may be an organic light-emitting diode (OLED) structural layer, and the corresponding organic light-emitting device 121 may be an OLED device. As a further example, the display structure layer 121 may be a quantum-dot light-emitting diode (QLED) structural layer, and the corresponding light-emitting device 121 may be a QLED device.

Referring now to each of FIGS. 7-11, schematic structural diagrams 700, 800, 900, 1000, and 1100 are depicted, respectively. Further, the schematic structural diagrams 700, 800, 900, 1000, and 1100 correspond to third, fourth, fifth, sixth, and seventh examples of the display panel 21, respectively. The display panel 21 may further include a flat layer, or first flat layer, or planarization layer, or first planarization layer, 16 covering at least the display area D. The flat layer 16 can flatten a given encapsulation layer formed on a side away from the flexible substrate 11, thereby improving the flatness of the display panel 21 and concomitantly improving the over quality of the display panel 21. In some examples, the flat layer 16 may be made of a polyimide material.

In one example, the one or more grooves (e.g., 14) may be classified according to different regions where grooves may be disposed on the flexible substrate 11. For example, the one or more grooves 14 may include one or both of one or more first grooves 141 and one or more second grooves 142. In some examples, the one or more grooves 14 may be a plurality of grooves arranged at intervals, such that each groove of the plurality of grooves 14 may be spaced apart from each adjacent groove in the plurality of grooves 14. In some examples, the plurality of grooves may be of various types. In one example, the plurality of grooves may be classified according to different regions where grooves may be disposed on the flexible substrate 11. For example, the plurality of grooves may include one or both of the one or more first grooves 141 and the one or more second grooves 142.

In some examples, the one or more first grooves 141 are located between the display area D and an edge of the flat layer 16. Said another way, the one or more first grooves 141 are located in a first area between an edge of the display area D and the edge of the flat layer 16. In one example, the first area may include the first annular region C1. In some examples, the one or more second grooves 142 are located in a second area between the edge of the flat layer 16 and the dam structure 13, and may be disposed around the flat layer 16. In one example, the second area may include the second annular region C2.

The display panel 21 may further include a buffer layer 17 on a side of the flexible substrate 11. In some examples, the buffer layer 17 may be made of silicon dioxide or silicon nitride. The buffer layer 17 may be included to alleviate damage to the flexible substrate 11 by an external force. The buffer layer 17 may further prevent impurities from entering a semiconductor active layer of a thin film transistor (TFT) to avoid performance degradation of the TFT.

The display panel 21 may further include a second wire layer 18 located on a side of the buffer layer 17 away from the flexible substrate 11. In some examples, the second wire layer 18 may be a common wire, or com wire, layer, including a plurality of common lines for introducing an external signal. In some examples, the second wire layer 18 may be made of a polysilicon material.

The display panel 21 may further include an insulating layer 19 located on a side of the second wire layer 18 away from the flexible substrate 11, and a third wire layer 101 located on a side of the display structure layer 12 closest to the flexible substrate 11. In some examples, the third wire layer 101 may be a cathode wire layer, including a plurality of cathode wires for connecting to a cathode layer in the display structure layer 12. In some examples, the third wire layer 101 may be made of metallic silver.

The display panel 21 may further include a second flat layer, or second planarization layer, 102 located on a side of the display structure layer 12 away from the flexible substrate 11. The second flat layer 102 may flatten a given encapsulation film layer located on a side thereof away from the flexible substrate 11. In some examples, the second flat layer may be made of a polyimide material.

The outgas region C1 of the display panel 21 may be located between the edge of the display structure layer 12 and the edge of the flat layer 16. In some examples, the third wire layer 101 and the second flat layer 102 may be provided with an air outlet hole in the outgas region C1, where gas generated in film layers covered by the third wire layer 101 and the second flat layer 102 during the manufacturing process can be released, thereby improving product yield.

As shown in FIGS. 7-11, an encapsulation layer 15 may include an organic encapsulation layer 151. In some examples, the encapsulation layer 151 may further include a first inorganic encapsulation layer 152 located on side of the organic encapsulation layer 151 closest to the flexible substrate 11, and a second inorganic encapsulation layer 153 located on a side of the organic encapsulation layer 151 away from the flexible substrate 11. The inorganic encapsulation layers 152, 153 may block moisture and oxygen, further ensuring the overall quality of the display panel 21. Further, the inorganic encapsulation layers 152, 153 may have a threshold hardness which may prevent said layers from being damaged during use of the display panel 21.

As shown in FIGS. 8-11, the flexible substrate 11 in the display panel 21 may include a first organic layer 111, a first inorganic layer 112, a second organic layer 113, and a second inorganic layer 114 which are sequentially stacked, and which may ensure toughness, or hardness, of the flexible substrate 11, thereby facilitating coating of other layers. In some embodiments, the flexible substrate 11 in the display panel 21 may include a first organic layer 111, a first inorganic layer 112, and a second organic layer 113.

In some examples, each of the first organic layer 111 and the second organic layer 113 may be made of a polyimide material. In some examples, each of the first inorganic layer 112 and the second inorganic layer 114 may be made of silicon nitride or silicon oxide. In some examples, the first inorganic encapsulation layer 152 may be made of silicon oxynitride. As such, the first inorganic encapsulation layer 152 may have a high contact energy with the second flat layer 102 and may thereby be firmly disposed on the second flat layer 102. In some examples, the second inorganic encapsulation layer 153 may be made of silicon nitride.

Figure 7:
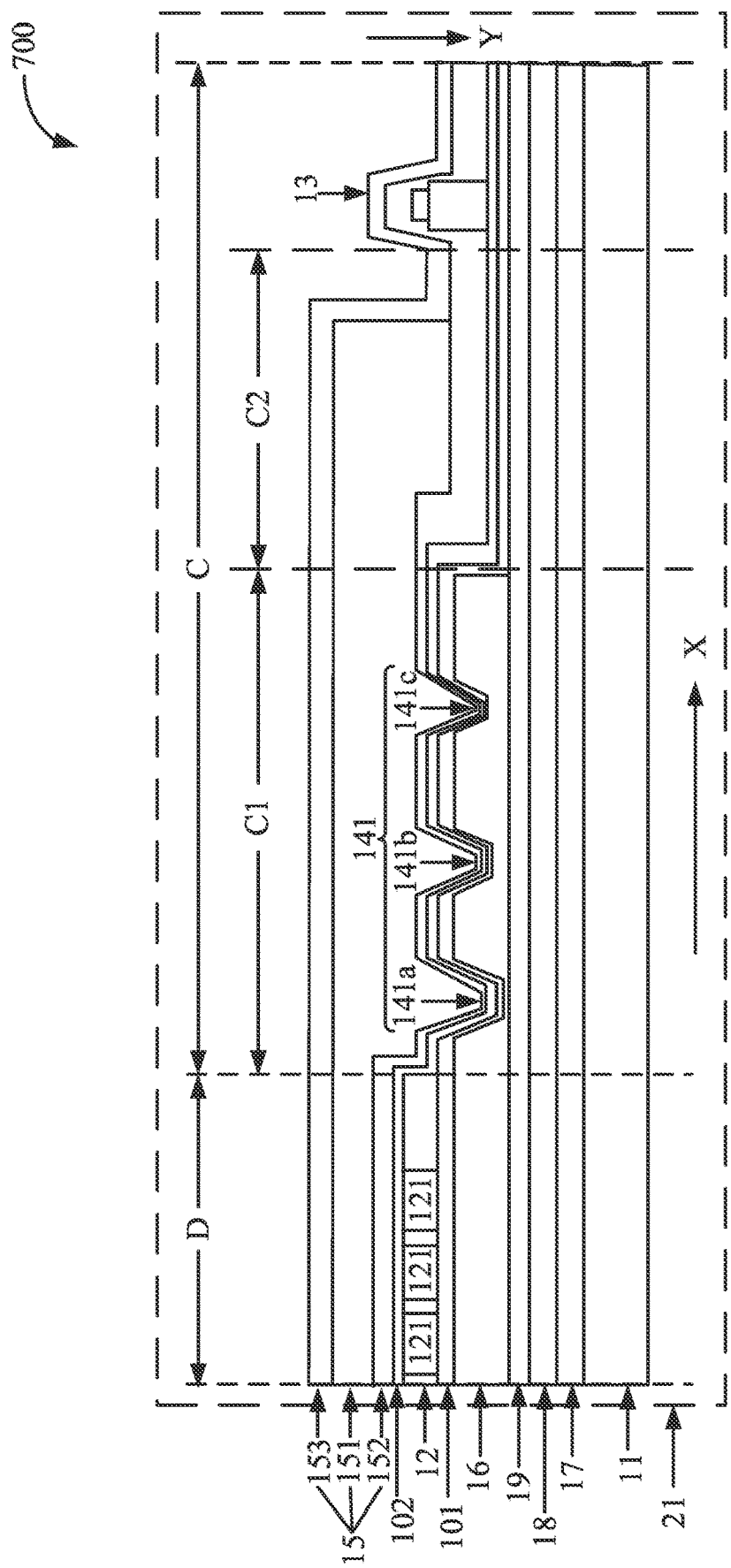
FIG. 7 shows a schematic structural diagram of a third example of the display panel.
Figure 8:
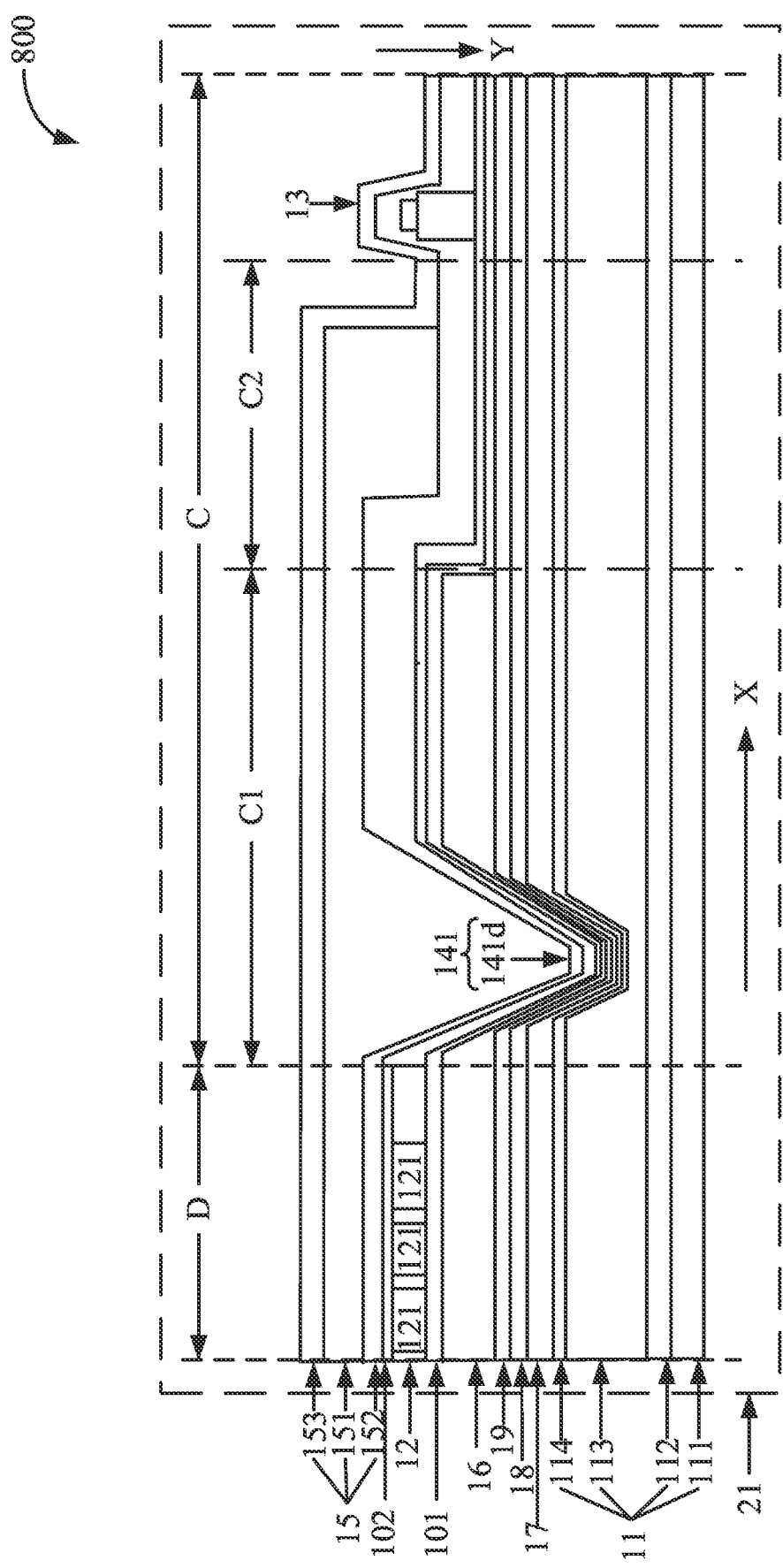
FIG. 8 shows a schematic structural diagram of a fourth example of the display panel.

As shown in FIGS. 7 and 8, one or more first grooves 141 may surround the display area D, and may be disposed on the flat layer 16 or on the flexible substrate 11 in the first annular region C1 between the display area D and the edge of the flat layer 16. As an example, and as shown in FIG. 7, three first grooves 141a, 141b, and 141c are disposed on the flat layer 16 in the first annular region C1. As another example, and as shown in FIG. 8, one first groove 141d is disposed on the second organic layer 113 of the flexible substrate 11 in the first annular region C1.

Figure 9:
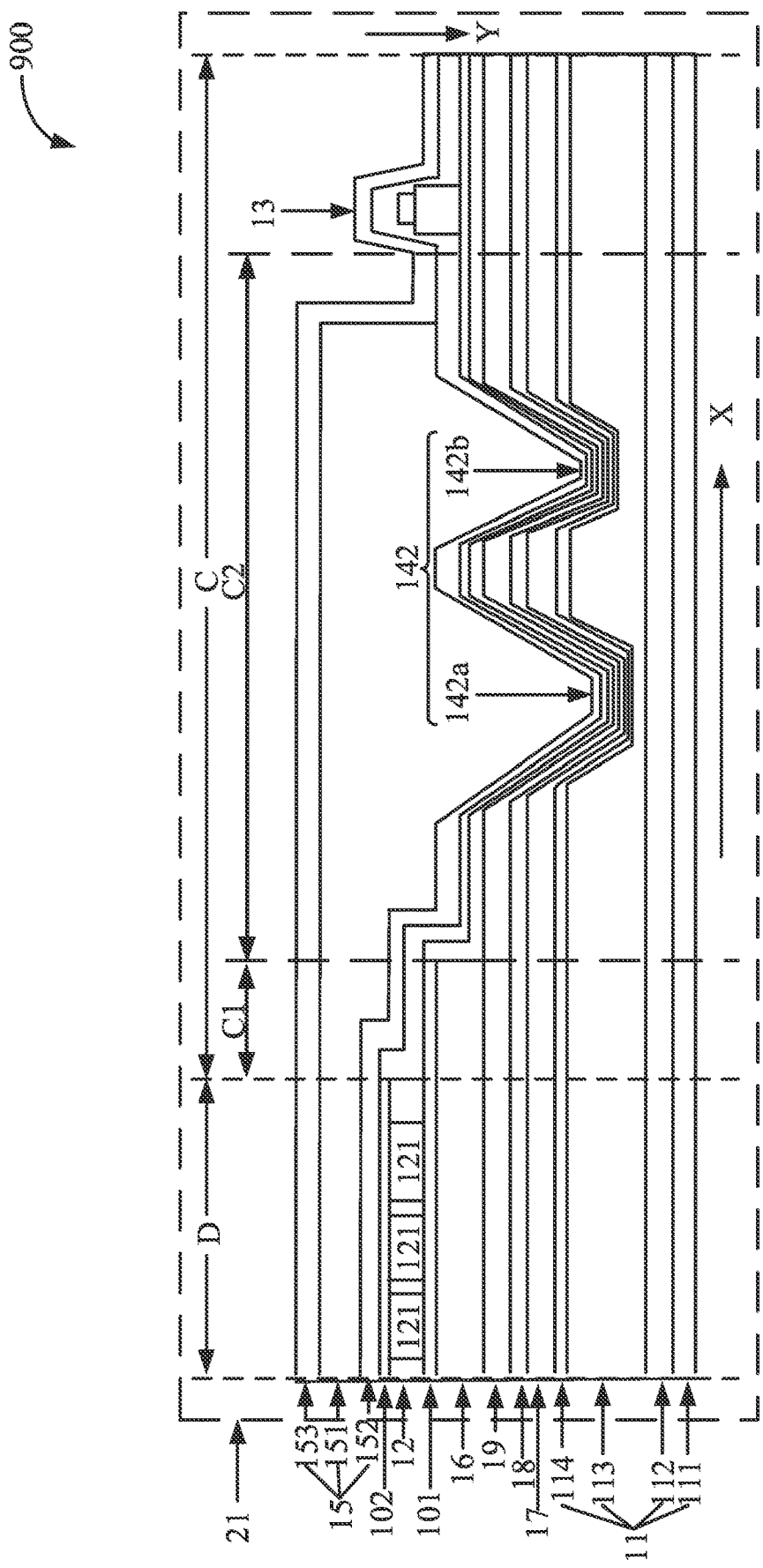
FIG. 9 shows a schematic structural diagram of a fifth example of the display panel.

As shown in FIG. 9, one or more second grooves 142 may surround the flat layer 16 (and, therefore, surround the display area D), and may be disposed on the flexible substrate 11 in the second annular region C2 between the edge of the flat layer 16 and the dam structure 13. As an example, and as shown in FIG. 9, two second grooves 142a and 142b are disposed on the second organic layer 113 of the flexible substrate 11 in the second annular region C2.

Figure 10:
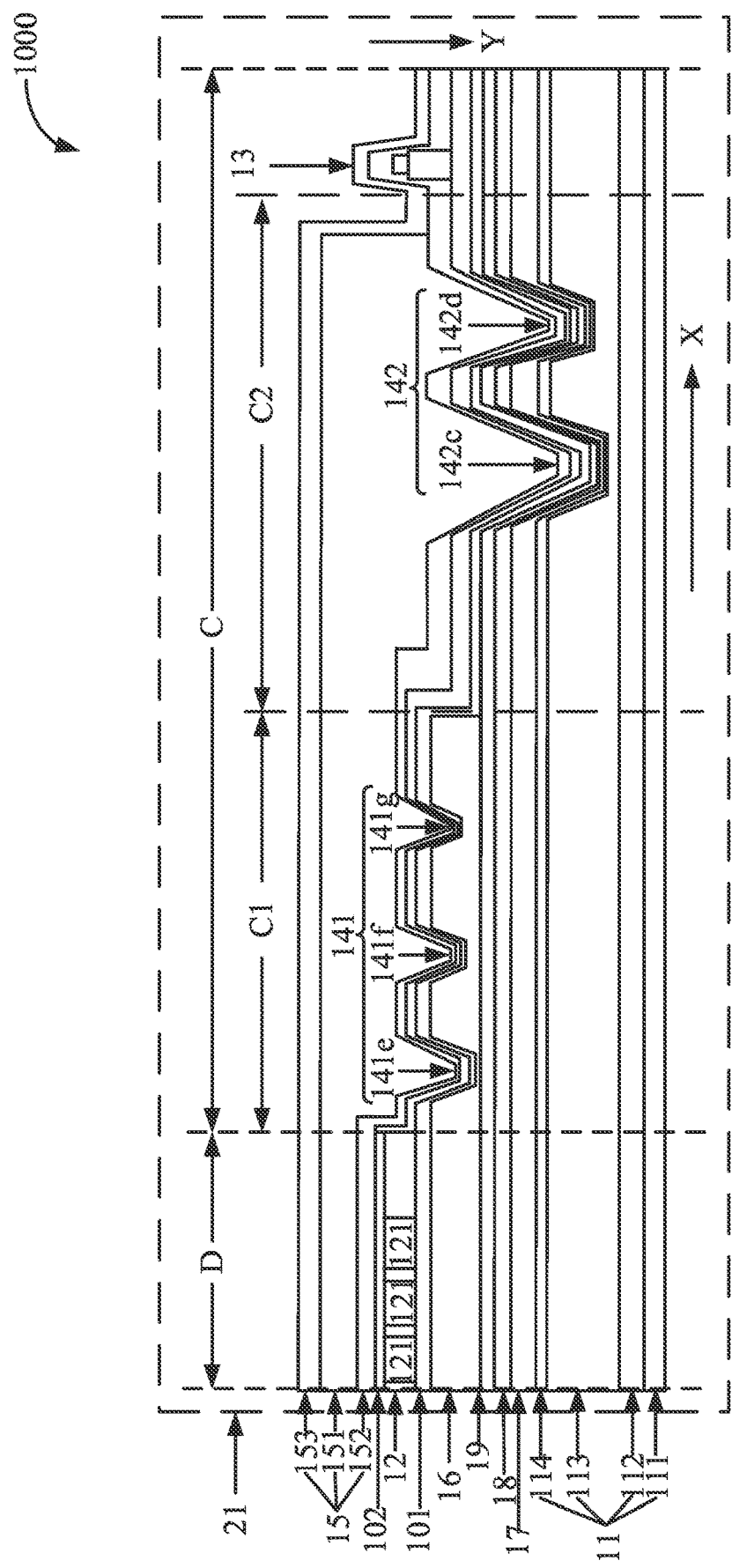
FIG. 10 shows a schematic structural diagram of a sixth example of the display panel.
Figure 11:
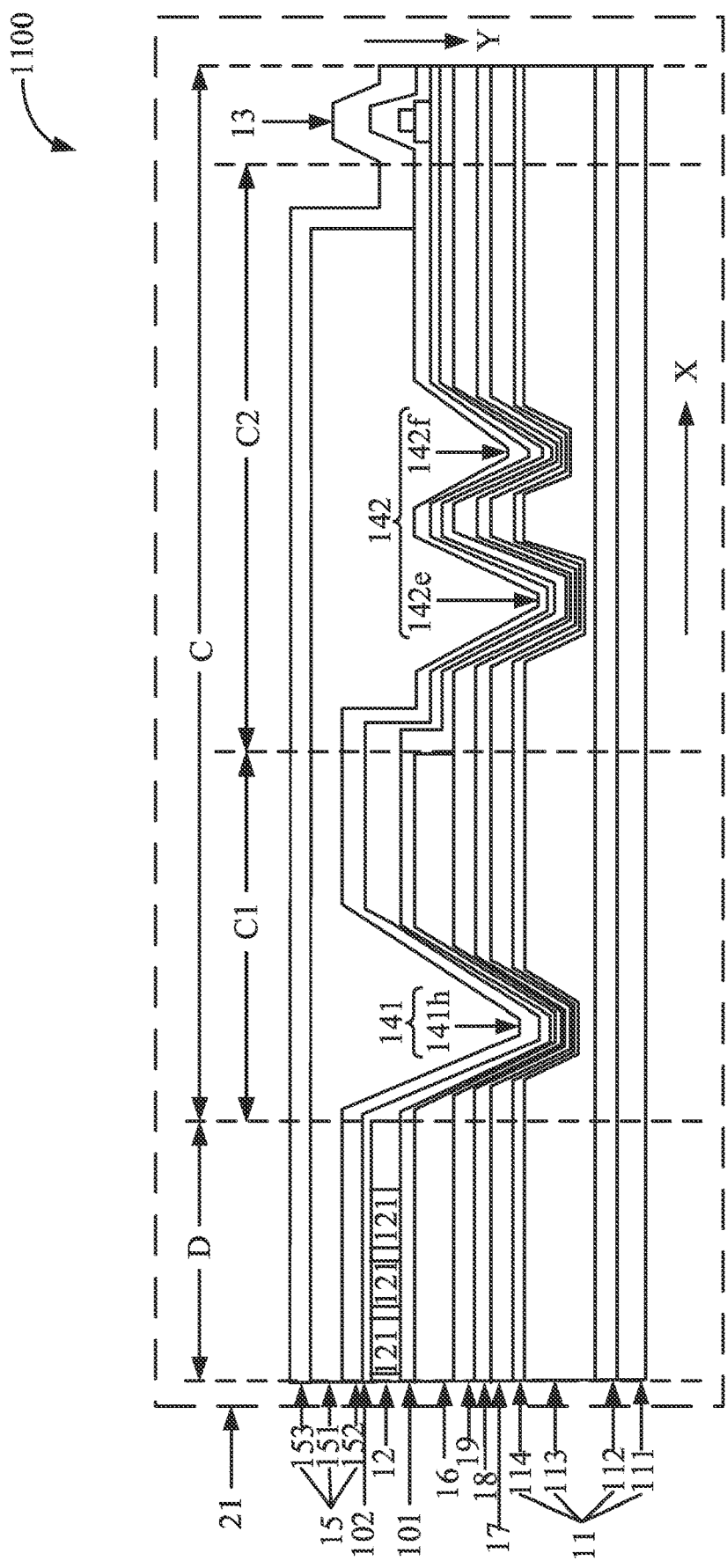
FIG. 11 shows a schematic structural diagram of a seventh example of the display panel.
Figure 12:
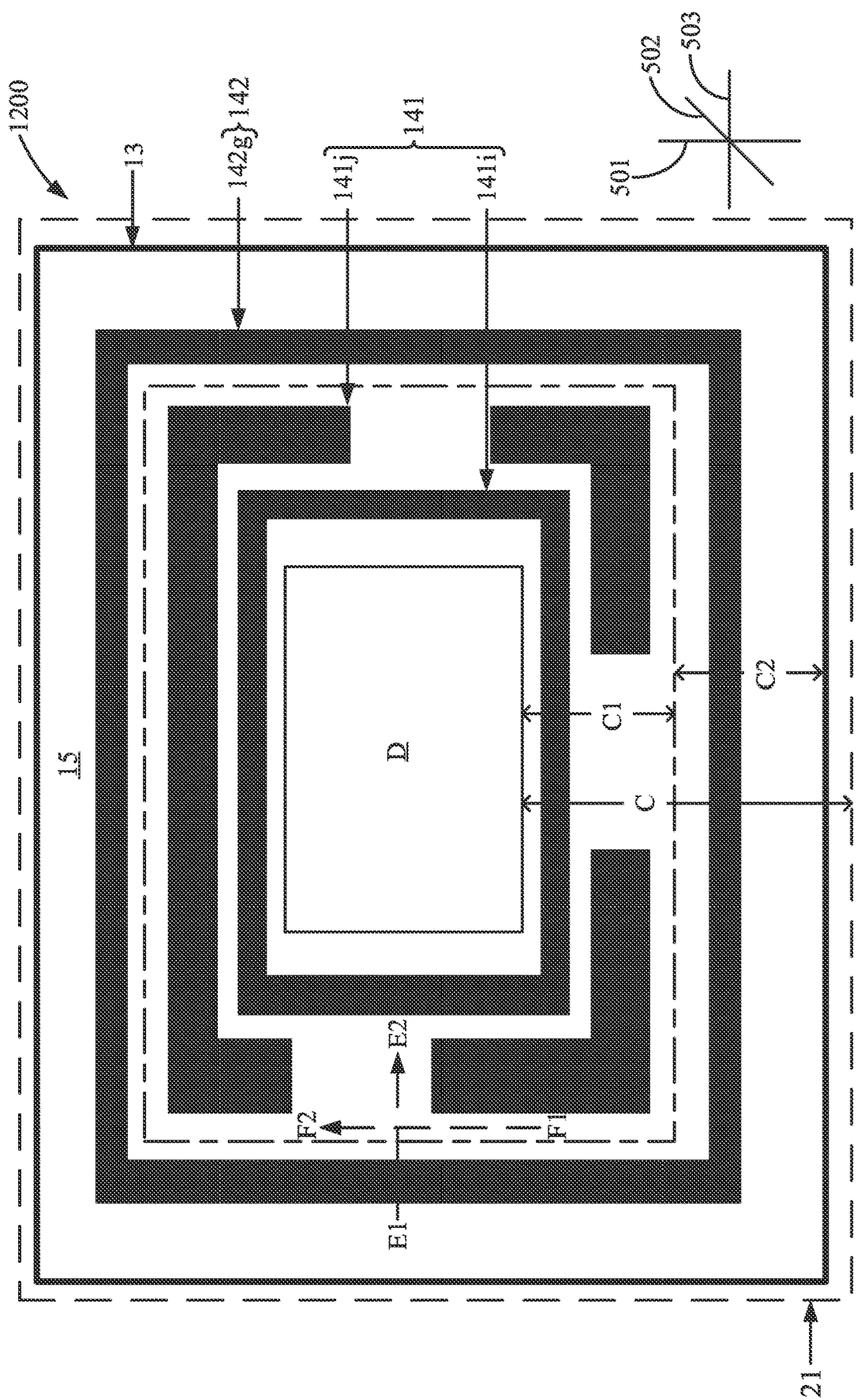
FIG. 12 shows a top view of a plurality of grooves disposed in the display panel.

As shown in FIGS. 10 and 11, one or more first grooves 141 may surround the display area D, and may be disposed on the flat layer 16 or on the flexible substrate 11 in the first annular region C1 between the display area D and the edge of the flat layer 16. Additionally, one or more second grooves 142 may surround the flat layer 16 (and, therefore, surround the display area D), and may be disposed on the flexible substrate 11 in the second annular region C2 between the edge of the flat layer 16 and the dam structure 13. As an example, and as shown in FIG. 10, three first grooves 141e, 141f, and 141g are disposed on the flat layer 16 in the first annular region C1, and two second grooves 142c and 142d are disposed on the second organic layer 113 of the flexible substrate 11 in the second annular region C2. As another example, and as shown in FIG. 11, one first groove 141h is disposed on the second organic layer 113 of the flexible substrate 11 in the first annular region C1, and two second grooves 141e and 141f are disposed on the second organic layer 113 of the flexible substrate 11 in the second annular region C2.

Referring now to FIGS. 7-11, the flat layer 16 may be made of an organic material. Further, when one or more grooves (e.g., 14) are disposed on the flat layer 16, a contact area of the flat layer 16 with a given encapsulation layer, such as the first inorganic encapsulation layer 152, disposed thereon is increased. As such, when the display panel 21 is deformed from outside, stress, or mechanical stress, generated by the first inorganic encapsulation layer 152, is effectively released to the flat layer 16. Thus, the flat layer 16 serves a buffering function to prevent damage to the display panel 21 by an external force. Said another way, when outside stress deforms the display panel 21, an interaction force is generated between film layers in the display panel 21. In some examples, a Young's modulus of the first inorganic encapsulation layer 152 may be about 50 to 60 times larger than a Young's modulus of the flat layer 16.

In a manufacturing process, a thickness of the flat layer 16 is typically around 1.5 to 1.8 μm, and a depth of the one or more grooves (e.g., 14) on the flat layer 16 is relatively shallow. In some examples, the thickness of the flat layer 16 is around 1.5 μm. As such, a flow rate of organic material can be slowed down during formation of the organic encapsulation layer 151, such that the organic encapsulation layer 151 is relatively flat and a slope angle of an edge of the organic encapsulation layer 151 is relatively small.

The flexible substrate 11 may have a plurality of hierarchical structures. As an example, the flexible substrate 11 may include an organic layer, such as the first organic layer 111 or the second organic layer 113. As another example, the flexible substrate may include the organic layer and an inorganic layer, such as the first inorganic layer 112 or the second inorganic layer 114, which are disposed in a stacked manner. When the one or more grooves (e.g., 14) are disposed on the flexible substrate 11, said grooves 14 may be disposed on the organic layer of the flexible substrate 11. As shown in FIGS. 8-11, the flexible substrate 11 may include the first organic layer 111, the first inorganic layer 112, the second organic layer 113, and the second inorganic layer 114 which are sequentially stacked. When the one or more grooves 14 are disposed on the flexible substrate 11, one or both of the one or more first grooves 141 and the one or more second grooves 142 may be located on a side of the second organic layer 113 adjacent to the second inorganic layer 114. Since the second organic layer 113 is made of an organic material, when the one or more grooves 14 are disposed on the second organic layer 113, a contact area of the second inorganic layer 114 with the second organic layer 113 is increased. When the display panel 21 is deformed from the outside, stress generated by the second inorganic layer 114 is thus effectively released to the second organic layer 113 so that the second organic layer 113 plays a buffering role to prevent damage of the display panel 21 by an external force. In some examples, a Young's modulus of the second inorganic layer 114 may be about 50 to 60 times larger than a Young's modulus of the second organic layer 113.

A thickness of the second organic layer 113 is typically around 10 μm, and a depth (defined with respect to the direction Y) of the one or more grooves (e.g., 14) disposed thereon is relatively deep. As such, the flow rate of the organic material can be quickly slowed down during formation of the organic encapsulation layer 151, and thereby prevent the organic material from overflowing the dam structure 13 which defines the edge of the organic encapsulation layer 151.

As shown in FIGS. 7 and 10, when the one or more first grooves 141 is a plurality of first grooves, the plurality of first grooves may gradually decrease in depth (defined with respect to the direction Y) in the direction X away from the display area D. Similarly, and as shown in FIGS. 9-11, when the one or more second grooves 142 is a plurality of second grooves, the plurality of second grooves may gradually decrease in depth in the direction X away from the display area D. In a process of encapsulation the display panel 21 with an organic material, in examples wherein the one or more grooves (e.g., 14) gradually decrease in depth, each groove 14 can drain the organic material. As such, the flow rate of the organic material may be gradually slowed away from the display structure layer 12 located in the display area D. Because the one or more grooves 14 may gradually decrease in depth as described above, a groove 14 with a deepest depth first contacts the organic material with a faster flow rate, and a groove 14 with a shallowest depth, contacting the organic material last, has a slower contact flow rate. The thickness of the organic material thus becomes more uniform, reducing the level difference such that the organic material is uniformly distributed in various regions of the non-display area C, thereby ensuring the flatness of the organic encapsulation layer 151 formed therefrom.

Further, a width of an opening of each groove (e.g., 14) in the display panel 21 is larger than a width of a bottom of said groove 14. For example, a cross section thereof (that is, the cross section defined by the axes 501 and 502) has an inverted trapezoidal shape, such as an isosceles trapezoid, which narrows in the direction Y towards the flexible substrate 11. Such a shape of the groove 14 not only facilitates drainage of organic material in forming the organic encapsulation layer 151, but also increases the contact area of the organic encapsulation layer 151 with a given substrate, ensure flatness of the display panel 21, and reduce peeling of the organic encapsulation layer 151, said substrate, or other film layers of the display panel 21 when subjected to an external force. Thus, the overall quality of the display panel 21 is improved.

In some examples, the one or more grooves (e.g., 14) may include one or both of a discontinuous, or non-annular, groove and a non-interrupted, or continuous, or annular, groove.

Referring now to FIG. 12, a top view 1200 is depicted of the one or more first grooves 141 and the one or more second grooves 142 of the display panel 21 having the display area D and the non-display area C. The one or more grooves are disposed in the non-display area C, and include two first grooves 141i and 141j and one second groove 142g. The first grooves 141i and 141j are disposed in the first annular region C1 and the second groove 142g is disposed in the second annular region C2. The first groove 141i and the second groove 142g are non-interrupted grooves and the first groove 141j is a discontinuous groove. In one example, the first groove 141j is a discontinuous groove such that a flow rate of organic material to the second annular region C2 may be relatively increased. During an encapsulation process, each type of groove allows organic material to flow into the groove in directions along the axes 501 and 503, thereby draining the organic material. It will be appreciated that an arrangement of grooves depicted in FIG. 12 is only an example, and differing arrangements may be utilized within the scope of this disclosure. Further, the width of the opening of each groove may be equal or unequal to the width of the opening of any other groove.

Referring now to FIGS. 1-4, a related display device may include the related display panel and a transparent cover. The related display device may be a 3D display device, such as a curved display device, and the transparent cover may be a 3D transparent cover, such as a curved transparent cover. Since the flatness 315 at an edge of the encapsulation layer 31 is low and a slope angle 314 is large, the 3D transparent cover is easily damaged. Further, the 3D transparent cover is easily peeled off from the encapsulation layer 31 by an external force, which may separate the 3D transparent cover from the related display panel in the related display device.

Referring now to FIGS. 13 and 14, a first cross-sectional view 1300 and a second cross-sectional view 1400 are shown of the encapsulation layer 15, respectively. Lines E1-E2 and F1-F2 define axes for the first cross-sectional view 1300 and the second cross-sectional view 1400, respectively. Further, the line E1-E2 is parallel to the axis 503 and the line F1-F2 is parallel to the axis 501. As described in more detail with reference to FIGS. 5-11, the encapsulation layer 15 includes the first inorganic encapsulation layer 152, the organic encapsulation layer 151, and the second inorganic encapsulation layer 153, which are sequentially stacked.

In the display panel (e.g., 21) provided by an embodiment of the present disclosure, the one or more grooves (e.g., 14) surrounding the display area (e.g., D) of the display panel 21 are disposed in the non-display area (e.g., C) between the edge of the display structure layer (e.g., 12) and the dam structure (e.g., 13), such that organic material may be drained through the one or more grooves 14 during a manufacturing process. The edge of the organic encapsulation layer 151 thereby formed thus has a smaller slope angle and a higher flatness as compared to the encapsulation layer 31 of FIGS. 1-4. As such, the encapsulation layer 15 including the organic encapsulation layer 151 has a correspondingly small slope angle 154 and high flatness 155. Further, when a 3D transparent cover is placed on a side of the display panel 21 having the encapsulation layer 15, peeling said cover off from the encapsulation layer 15 under external force is more difficult, thereby preventing separation of the 3D transparent cover from the display panel 21 in, for example, a display device.

Referring to FIGS. 1-4, in order to improve a degree of integration of the related display device described above, the related display device may further integrate a touch function. As such, the transparent cover of the related display device typically includes a transparent substrate and a polarizer superimposed on the transparent substrate, and a touch line, or touch unit, or touch sensor, for implementing the touch function. After a manufacturing process of the related display panel is completed, a side of the transparent cover provided with the touch line is placed in face-sharing contact with a side of the related display panel having the encapsulation layer 31 to obtain the related display device.

However, since the flatness 315 of the edge of the encapsulation layer 31 is low and the slope angle 314 is large, the touch line is difficult to manufacture on a surface of the encapsulation layer 31. Even if the touch line is disposed on the surface of the encapsulation layer 31, the touch line is easily damaged, and is easily peeled off from the encapsulation layer 31 by an external force.

In the present disclosure, a flexible multilayering on cell (FMLOC) process is proposed, in which a touch line originally manufactured on a transparent cover is disposed on the display panel (e.g., 21), that is, the touch line is disposed on the encapsulation layer (e.g., 15). As such, a touch function may be provided to a display device including the display panel 21.

Referring now to FIGS. 13 and 14, the edge of the encapsulation layer 15 of the display panel (e.g., 21) has a high flatness 155 and a small slope angle 154, which provides an ideal manufacturing environment for the FMLOC process. Further, the touch line can be effectively formed on the encapsulation layer 15, or on the organic encapsulation layer 151, while avoiding damage to the touch line and reducing a risk of peeling off from the encapsulation layer 15, or from the organic encapsulation layer 151, under an external force. Thus, in some examples, the display panel 21 further includes the touch line located on the side of the organic encapsulation layer 151 away from the flexible substrate (e.g., 11).

In summary, the display panel 21 provided by an embodiment of the present disclosure and described with reference to FIGS. 5-14 includes the flexible substrate 11 having the display area D and the non-display area C, and the one or more grooves 14 disposed on the non-display area C between the display area D and the dam structure 13. When the organic encapsulation layer 151 is formed, the one or more grooves 14 can drain organic material, thereby increasing the flatness of the organic encapsulation layer 151, which further increases the flatness 155 and reduces the slope angle 154 of the edge of the encapsulation layer 15 as a whole. Further, via such draining by the one or more grooves 14, the contact area of the organic encapsulation layer 151 with a substrate disposed thereon can be increased, thereby reducing peeling between the organic encapsulation layer 151 and said substrate, and improving the overall quality of the display panel 21. In some examples, fabrication of the touch line is also facilitated.

Further, and as will be described below with reference to FIGS. 15-17, a display device is provided by an embodiment of the present disclosure. It will be appreciated that the direction X and the direction Y as depicted by FIGS. 15-17 are defined in a manner equivalent to the direction X and the direction Y as depicted by FIGS. 5-11.

Figure 15:
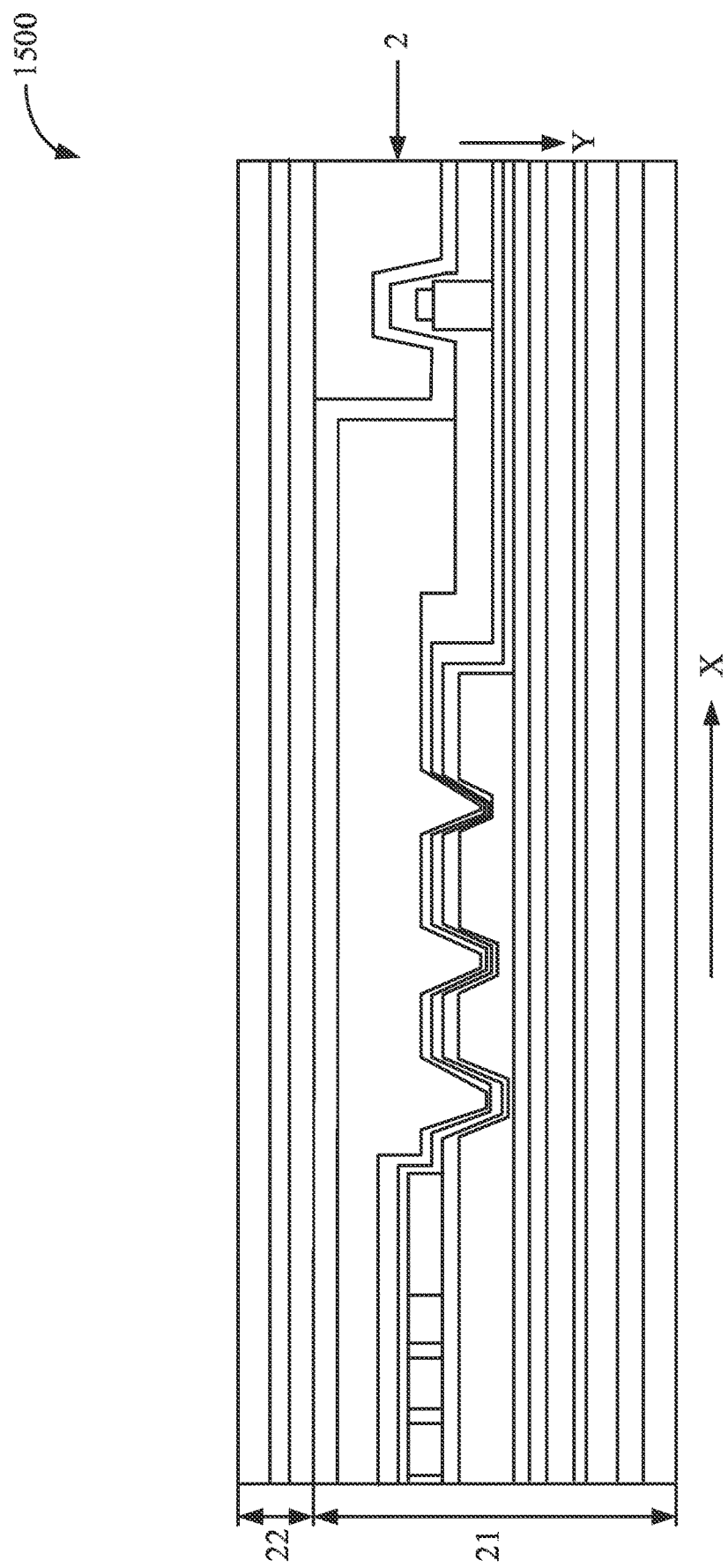
FIG. 15 shows a schematic structural diagram of a first example of a display device according to an embodiment of the present disclosure.

Referring now to FIG. 15, a schematic structural diagram 1500 of a first example of a display device 2 is depicted. The display device 2 includes the display panel 21 provided by an embodiment of the present disclosure and a transparent cover 22, where the transparent cover 22 is in face-sharing contact with the display panel 21.

As described hereinabove, the display device 2 may be integrated with a touch function. The touch line, such as touch line 223 described hereinbelow with reference to FIGS. 16 and 17, for implementing the touch function may be disposed on the transparent cover 22 or the display panel 21.

Figure 16:
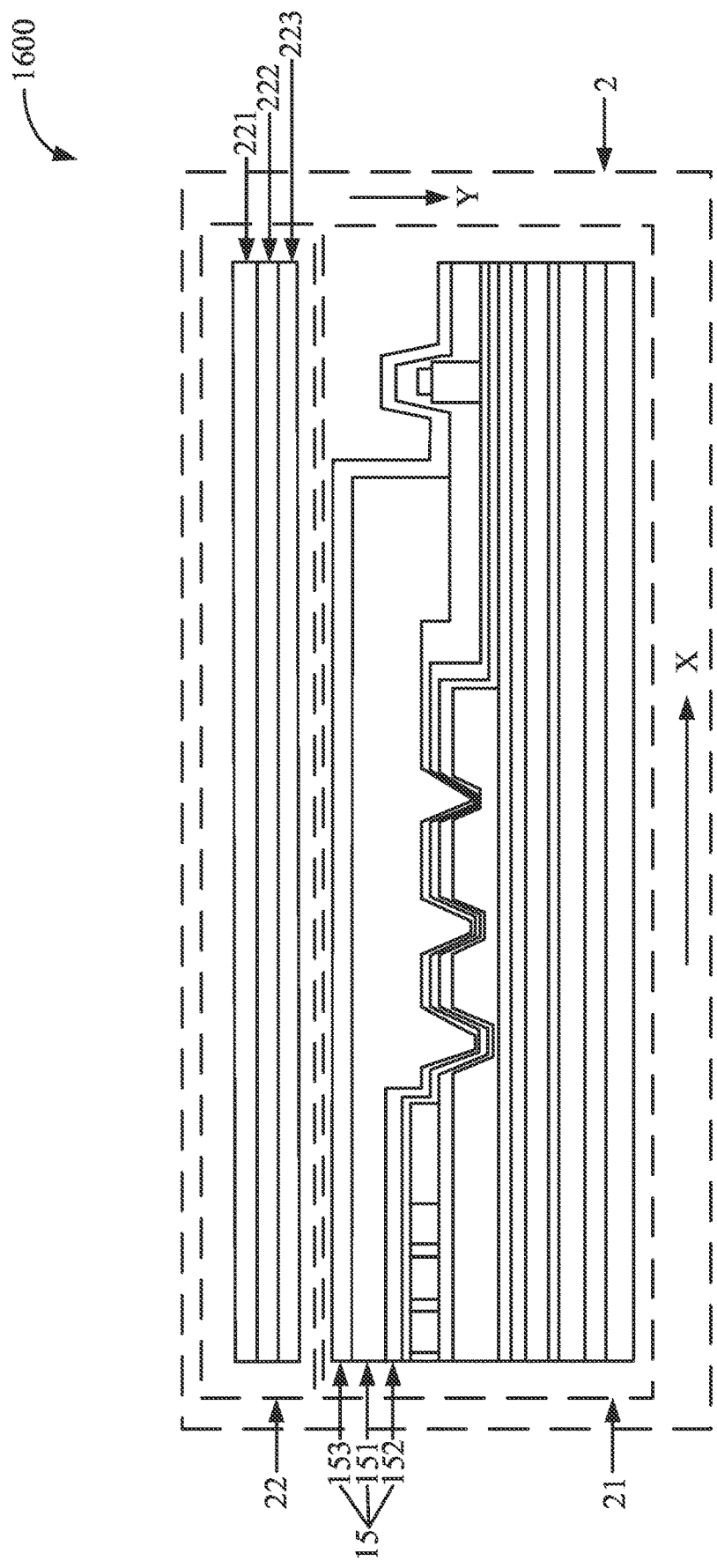
FIG. 16 shows a schematic structural diagram of a second example of the display device, and a first example of a manufacturing process thereof.
Figure 17:
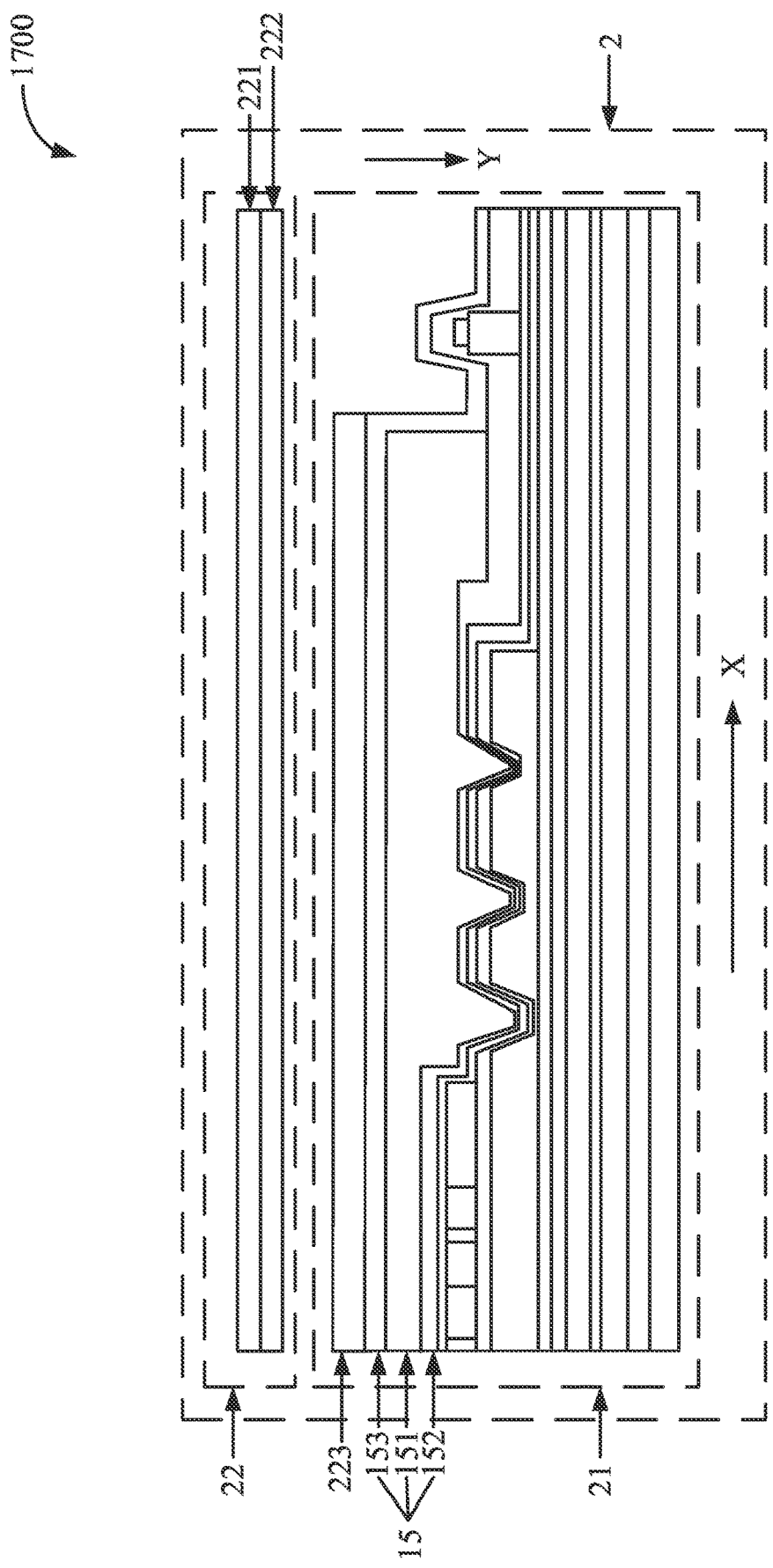
FIG. 17 shows a schematic structural diagram of a third example of the display device, and a second example of a manufacturing process thereof.

Referring now to FIG. 16, a schematic structural diagram 1600 of a second example of the display device 2 and a first example of a manufacturing process thereof is depicted. The transparent cover 22 includes a transparent substrate 221, and a polarizer 222 and a touch line 223 disposed on the transparent substrate 221. As such, during a manufacturing process of the display device 2, the display panel 21 is not initially provided with the touch line 223. A side of the transparent substrate 221 on which each of the polarizer 222 and the touch line 223 are disposed is in face-sharing contact with the display panel 21, that is, with the encapsulation layer 15 of the display panel 21.

Referring now to FIG. 17, a schematic structural diagram 1700 of a third example of the display device 2 and a second example of a manufacturing process thereof is depicted. The transparent cover 22 includes the transparent substrate 221, and the polarizer 222 disposed on the transparent substrate 221. The display panel 21 further includes the touch line 223 on the encapsulation layer 15. Further, a side of the transparent substrate 221 on which the polarizer 222 is disposed is in face-sharing contact with the display panel 21.

The display device 2 is manufactured by placing the transparent cover 22 on the display panel 21. As described hereinabove with reference to FIGS. 5-14, the display panel 21 includes a flexible substrate 11 having a display area D and a non-display area C, the one or more grooves 14 disposed on the non-display area C between the display area D and the dam structure 13. When the organic encapsulation layer 151 is formed, the one or more grooves 14 can drain organic material, thereby increasing the flatness of the organic encapsulation layer 151, which further increases the flatness 155 and reduces the slope angle 154 of the edge of the encapsulation layer 15 as a whole. Further, via such draining by the one or more grooves 14, the contact area of the organic encapsulation layer 151 with a substrate disposed thereon can be increased, thereby reducing peeling between the organic encapsulation layer 151 and said substrate, and improving the overall quality of the display panel 21 and therefore the display device 2 including the display panel 21.

As an example, and as shown in FIG. 16, the side of the transparent cover 22 on which each of the polarizer 222 and the touch line 223 are disposed may be placed in the Y direction onto the encapsulation layer 15 of the display panel 21 to form the display device 2. As another example, and as shown in FIG. 17, the side of the transparent cover 22 on which the polarizer 222 is disposed may be placed in the Y direction onto the display panel 21 to form the display device 2. In the examples described above, the touch line 223 is thereby disposed between the polarizer 222 of the transparent cover 22 and the encapsulation layer 15 of the display panel 21. In some examples, such as the examples depicted in FIGS. 16 and 17, the transparent cover 22 may be a 3D cover, a curved cover, or a flat cover.

In some examples, the display device 2, including the display panel 21, may be any product or component having a display function, such as a liquid crystal panel, electronic paper, a mobile phone, a smartphone, a tablet computer, a television, a notebook computer, a digital photo frame, a navigator, and the like. In some examples, the display device 2 may be a flexible display device.

In summary, the display device 2 is formed by placing the transparent cover 22 on the display panel 21. The display panel 21 includes the flexible substrate (e.g., 11) having the display area (e.g., D) and the non-display area (e.g., C), and the one or more grooves (e.g., 14) disposed on the non-display area C between the display area D and the dam structure (e.g., 13). When the organic encapsulation layer 151 is formed, the one or more grooves 14 can drain organic material, thereby increasing the flatness of the organic encapsulation layer 151, which further increases the flatness (e.g., 155) and reduces the slope angle (e.g., 154) of the edge of the encapsulation layer 15 as a whole. Further, via such draining by the one or more grooves 14, the contact area of the organic encapsulation layer 151 with a substrate disposed thereon can be increased, thereby reducing peeling between the organic encapsulation layer 151 and said substrate, and improving the overall quality of the display panel 21 and therefore the display device 2 including the display panel 21.

Further, and as will be described below with reference to FIGS. 18-24, methods of manufacturing the display panel are provided by an embodiment of the present disclosure. It should be understood that elements of the described methods of FIGS. 18-24 may be combined with one another to obtain more specific embodiments. For example, aspects of the method described with reference to FIG. 19 may be utilized in the method described with reference to FIG. 18.

Figure 18:
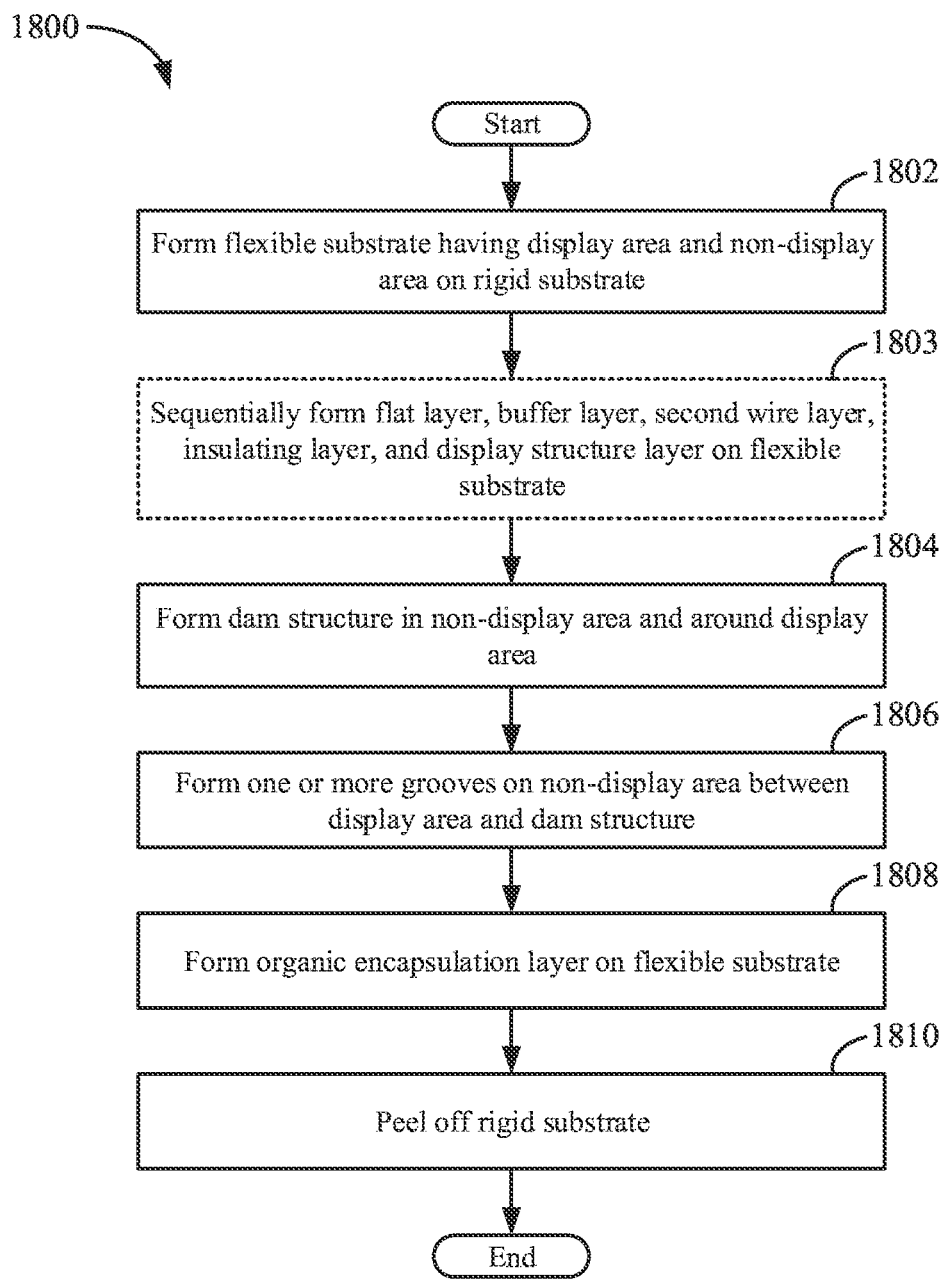
FIG. 18 shows a flow diagram of a first method of manufacturing the display panel according to an embodiment of the present disclosure.

Referring now to FIG. 18, a flow diagram 1800 of a first method of manufacturing the display panel (e.g., 21) is depicted.

At 1802, the flexible substrate (e.g., 11) having the display area (e.g., D) and the non-display area (e.g., C) may be formed on a rigid substrate, such as rigid substrate 23 described hereinbelow with reference to FIG. 21. In some examples, 1802 may further include all or part of a method for forming the flexible substrate 11 on the rigid substrate as described hereinbelow with reference to FIG. 19.

Figure 19:
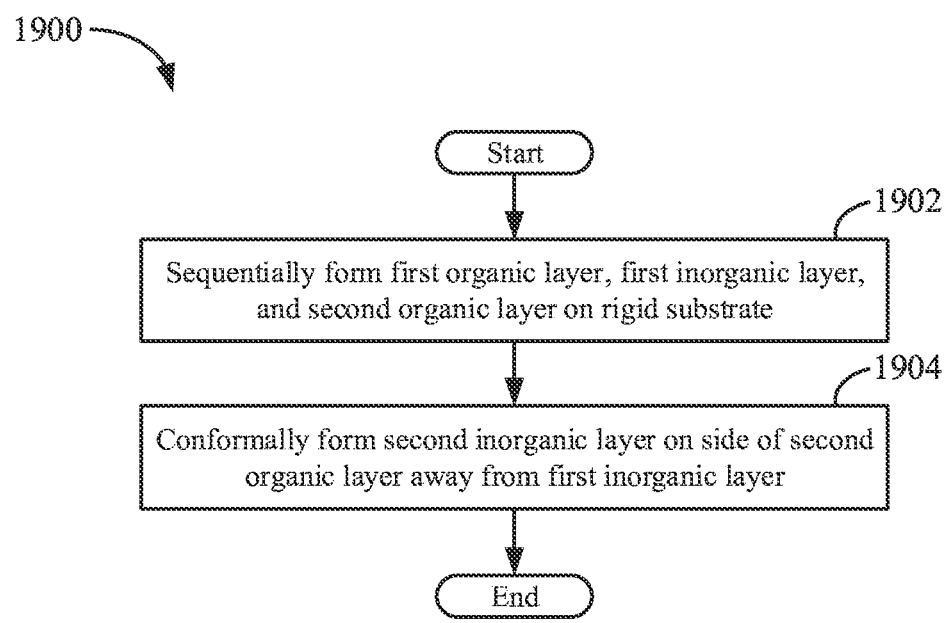
FIG. 19 shows a flow diagram of a method of forming a flexible substrate of the display panel.
Figure 21:
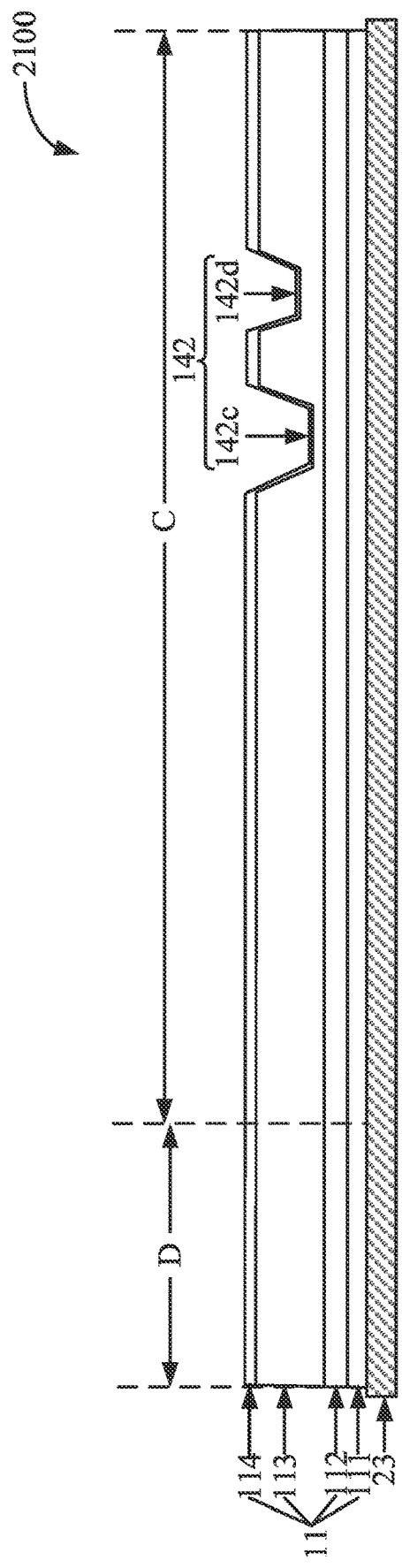
FIG. 21 shows a schematic structural diagram of a first example step of a manufacturing process of the display panel.

Referring now to FIG. 19, a flow diagram 1900 of a method of forming the flexible substrate (e.g., 11) on the rigid substrate, such as rigid substrate 23 described hereinbelow with reference to FIG. 21, is depicted.

At 1902, the first organic layer (e.g., 111), the first inorganic layer (e.g., 112), and the second organic layer (e.g., 113) may be sequentially formed on the rigid substrate. In some examples, wherein the one or more first grooves (e.g., 141) and the one or more second grooves (e.g., 142) are located on the flexible substrate (e.g., 11), one or both of the one or more first grooves 141 and the one or more second grooves 142 may be located on the second organic layer 113.

At 1904, the second inorganic layer (e.g., 114) may be conformally formed on a side of the second organic layer (e.g., 113) away from the first inorganic layer (e.g., 112) to form the flexible substrate (e.g., 11) on the rigid substrate. As used herein, "conformally" refers to maintaining a shape. For example, conformally forming a first film layer on a second film layer means that a shape of a surface of the first film layer is equivalent to a shape of a surface of the second film layer, such that the surface of the first film layer is in face-sharing contact with the surface of the second film layer.

Referring now to FIG. 18, optionally after 1802, at 1803, the flat layer (e.g., 16), the buffer layer (e.g., 17), the second wire layer (e.g., 18), the insulating layer (e.g., 19), and the display structure layer (e.g., 12) may be sequentially formed on the flexible substrate 11. In some examples, the display structure layer 12 may be an organic display structure layer, such as an OLED structural layer, or a QLED structural layer. In some examples, the display structure layer 12 may cover at least the display area D.

At 1804, the dam structure (e.g., 13) may be formed in the non-display area (e.g., C) and around the display area (e.g., D).

At 1806, the one or more grooves (e.g., 14) may be formed on the non-display area (e.g., C) between the display area (e.g., D) and the dam structure (e.g., 13). In some examples, the one or more grooves 14 may include one or both of a discontinuous, or non-annular, groove and a non-interrupted, or continuous, or annular, groove. In some examples, the width of the opening of each groove of the one or more grooves 14 may be greater than the width of the bottom of said groove. In some examples, the one or more grooves may include one or both of the one or more first grooves (e.g., 141) and the one or more second grooves (e.g., 142). In some examples, the one more first grooves may be formed on the flat layer (e.g., 16) or the flexible substrate (e.g., 11). In some examples, the one or more first grooves 141 may be a plurality of first grooves, and the plurality of first grooves may gradually decrease in depth in the direction (e.g., X) away from the display area D. In some examples, the one or more second grooves 142 may be formed on the flexible substrate 11. In some examples, the one or more second grooves 142 may be a plurality of second grooves, and the plurality of second grooves may gradually decrease in depth in the direction X away from the display area D.

At 1808, the organic encapsulation layer (e.g., 151) may be formed on the flexible substrate (e.g., 11). In some examples, each of the first inorganic encapsulation layer (e.g., 152) and the second inorganic encapsulation layer (e.g., 153) may be further formed on the side of the display structure layer (e.g., 12) away from the flexible substrate (e.g., 11). In some examples, the encapsulation layer (e.g., 15) may be formed from a sequential covering, or stacking, of the first inorganic encapsulation layer 152, the organic encapsulation layer 151, and the second inorganic encapsulation layer 153. In some examples, the organic encapsulation layer 151, or the encapsulation layer 15, may cover the display area (e.g., D), at least a portion of the non-display area (e.g., C), and the one or more grooves (e.g., 14).

At 1810, the rigid substrate may be peeled off.

In summary, the first method of manufacturing the display panel 21 includes forming the flexible substrate 11 having the display area D and the non-display area C on the rigid substrate. The dam structure 13 is then formed in the non-display area C and around the display area D. The one or more grooves 14 are then formed on the non-display area C between the display area D and the dam structure 13. The flexible substrate 11 is then covered with the organic encapsulation layer 151. The organic encapsulation layer 151 this formed, the one or more grooves 14 can drain organic material, thereby increasing the flatness of the organic encapsulation layer 151, which further increases the flatness (e.g., 155) and reduces the slope angle (e.g., 154) of the edge of the encapsulation layer 15 as a whole. Further, via such draining by the one or more grooves 14, the contact area of the organic encapsulation layer 151 with a substrate disposed thereon can be increased, thereby reducing peeling between the organic encapsulation layer 151 and said substrate, and improving the overall quality of the display panel 21. The rigid substrate is then peeled off.

Figure 20:
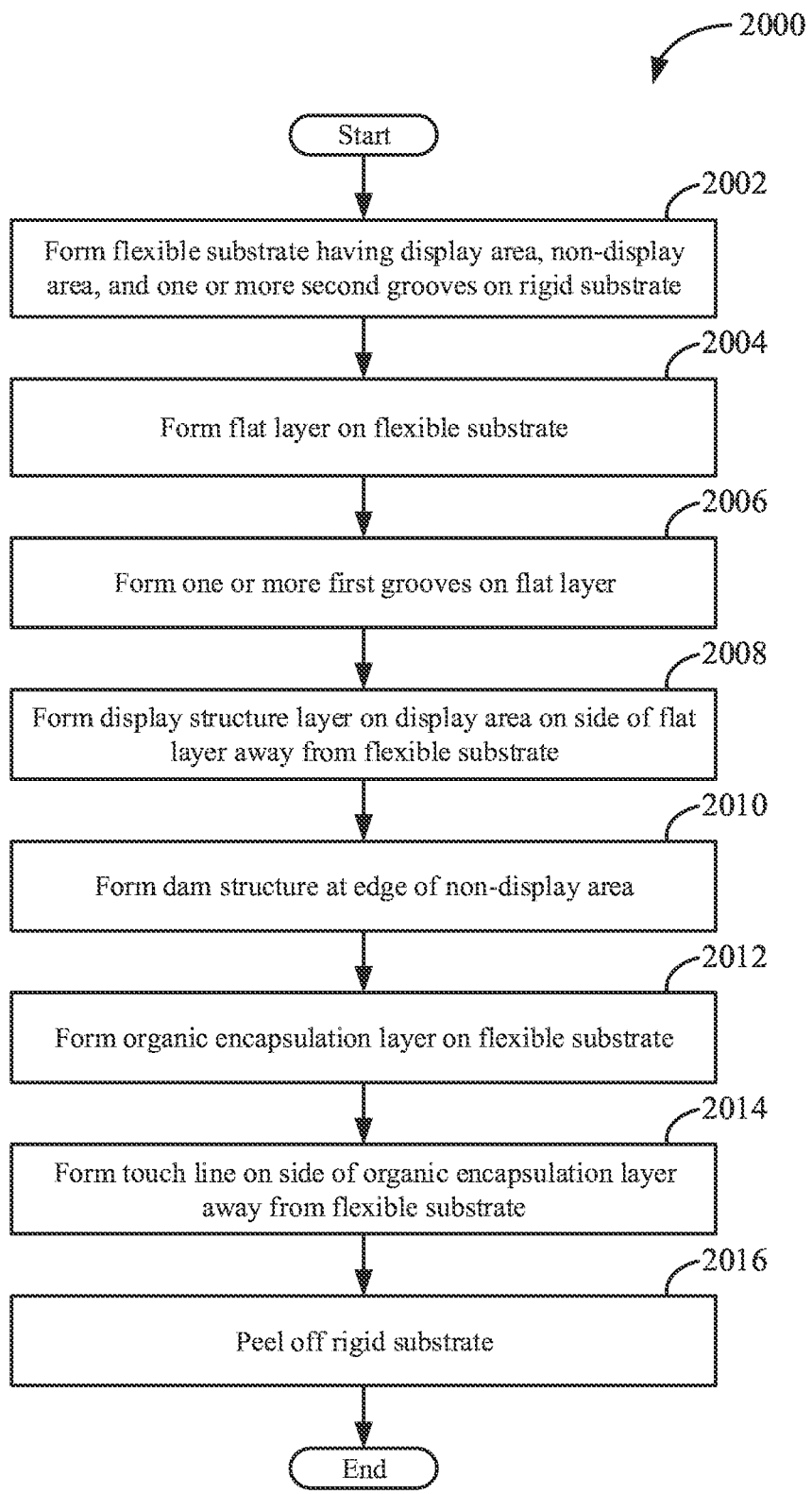
FIG. 20 shows a flow diagram of a second method of manufacturing the display panel according to an embodiment of the present disclosure.

Referring now to FIG. 20, a flow diagram 2000 of a second method of manufacturing the display panel (e.g., 21) is depicted. In one example, the display panel 21 thus formed is the display panel 21 described with reference to FIG. 10. As such, the one or more grooves (e.g., 14) includes the three first grooves 141e, 141f, and 141g and the two second grooves 142c and 142d. Further, the first grooves 141e, 141f, and 141g are located on the flat layer 16 and the second grooves 142c and 142d are located on the flexible substrate 11.

At 2002, the flexible substrate (e.g., 11) having the display area (e.g., D), the non-display area (e.g., C), and the one or more second grooves (e.g., 142) may be formed on the rigid substrate, such as rigid substrate 23 described hereinbelow with reference to FIG. 21. In some examples, the display area D may be an implementation area of a display function of the display panel 21, and the non-display area C may be an area outside of the display area D. Further details of forming of the flexible substrate 11 on the rigid substrate may be described hereinbelow with reference to FIG. 21.

Referring now to FIG. 21, a schematic structural diagram 2100 of a first example step of the manufacturing process of the display panel (e.g., 21) is depicted. The first organic layer 111, the first inorganic layer 112, and the second organic layer 113 are sequentially formed on the rigid substrate 23 by deposition, coating, sputtering, or the like. Once formed, the thickness of the second organic layer 113 may be around 10 µm. Further, once the second organic layer 113 is formed, a portion of the second organic layer 113 corresponding to the non-display area C is etched using a gray mask process, or grayscale mask process, to obtain the second grooves 142c and 142d of different depths. As used herein, the gray mask process may refer to a photolithography process, or composition process, or graphic process, using a gray mask, which includes photoresist coating, exposure, development, etching, and photoresist stripping. A transmittance, or light transmittance, of an area on the gray mask corresponding to where the second grooves 142c and 142d are located is different. For example, the photoresist may be a positive photoresist. As such, assuming that a first area is an area on the gray mask corresponding to where the second groove 142c having a deeper depth is located, and a second area is an area on the gray mask corresponding to where the second groove 142d having a shallower depth is located, then the light transmittance of the first area is greater than the second area.

After the second grooves 142c and 142d are formed on the second organic layer 113, the second inorganic layer 114 is conformally formed by depositing, coating, or sputtering (or the like) on the side of the second organic layer 113 away from the first organic layer 111 to form the flexible substrate 11 having the second grooves 142c and 142d.

Referring now to FIG. 20, at 2004, the flat layer (e.g., 16) may be formed on the flexible substrate (e.g., 11). In some examples, the flat layer 16 may cover at least the display area (e.g., D). In some examples, and as described hereinbelow with reference to FIG. 22, prior to forming the flat layer 16, further film layers that may assist in one or more functions of the display panel (e.g., 21) may be conformally formed on the flexible substrate 11 by way of deposition, coating, sputtering, or the like.

Figure 22:
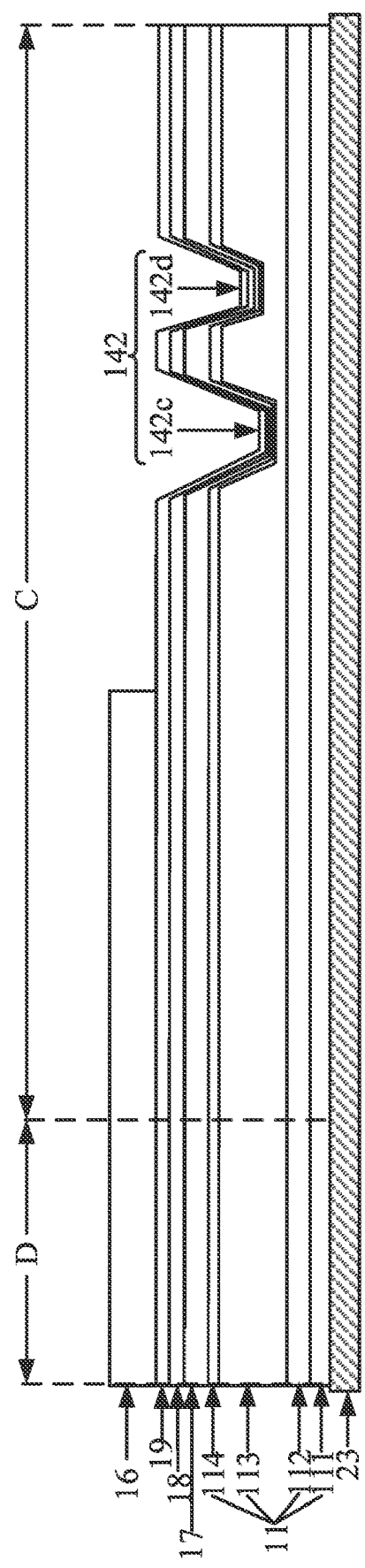
FIG. 22 shows a schematic structural diagram of a second example step of the manufacturing process of the display panel.

Referring now to FIG. 22, a schematic structural diagram 2200 of a second example step of the manufacturing process of the display panel (e.g., 21) is depicted. The buffer layer 17, the second wire layer 18, and the insulating layer 19 are sequentially and conformally coated on the side of the second inorganic layer 114 away from the first organic layer 111.

Further, the flat layer 16 covering at least the display area D may be formed on the side of the insulating layer 19 away from the flexible substrate 11. In some examples, the thickness of the flat layer 16 may be around 1.5 to 1.8 μm. In some examples, the thickness of the flat layer 16 may be around 1.5 μm.

Referring now to FIG. 20, at 2006, one or more first grooves (e.g., 141) may be formed on the flat layer (e.g., 16). Further details of forming of the one or more first grooves 141 on the flat layer 16 may be described hereinbelow with reference to FIG. 23.

Referring now to FIG. 23, a schematic structural diagram 2300 of a third example step of the manufacturing process of the display panel (e.g., 21) is depicted. The non-display area C of the flat layer 16 is etched using a gray mask process, such as the gray mask process described hereinabove with reference to FIG. 21, to obtain the first grooves 141e, 141f, and 141g of different depths.

Referring now to FIG. 20, at 2008, the display structure layer (e.g., 12) is formed on the display area (e.g., D) on the side of the flat layer (e.g., 16) away from the flexible substrate (e.g., 11). Further details of forming of the display structure layer 12 on the flat layer 16 may be described hereinbelow with reference to FIG. 24.

Referring now to FIG. 24, a schematic structural diagram 2400 of a fourth example step of the manufacturing process of the display panel (e.g., 21) is depicted. In some examples, a first wire layer (not shown in FIG. 24) is formed on the side of the insulating layer 19 away from the flexible substrate 11 by deposition, coating, sputtering, or the like, and then performing a photolithography process. In some examples, the first wire layer may be a source/drain wire layer including a source wire and a drain wire. In some examples, the first wire layer may not overlap with the flat layer 16. In some examples, the first wire layer may be made of titanium or aluminum. The third wire layer 101 is then formed on the side of the flat layer 16 away from the flexible substrate 11 by deposition, coating, sputtering, or the like, and then performing a photolithography process. In some examples, the third wire layer 101 may be a cathode wire layer. The display structure layer 12 is then formed in the display area D on the side of the third wire layer 101 away from the flexible substrate 11. In some examples, the display structure layer 12 may be an OLED structure layer, where the OLED structure layer includes a plurality of OLED devices 121.

Referring now to FIG. 20, at 2010, a dam structure (e.g., 13) may be formed at the edge of the non-display area (e.g., C). In some examples, the dam structure 13 may be in an annular, or ring, shape. In an example process, after the display structure layer (e.g., 12) is formed, a film layer may be formed on the flexible substrate (e.g., 11) by deposition, coating, sputtering, or the like. The film layer may then undergo a photolithography process to obtain the dam structure 13.

In some examples, the dam structure 13 may be simultaneously formed when the display structure layer 12 is formed such that forming the dam structure 13 and forming the display structure layer 12 share at least one patterning process. For example, the dam structure 13 may include a first structural layer and a second structural layer. The first structural layer may be formed in the same layer as the pixel definition layer in the display structure layer 12, that is, formed by the same photolithography process. Further, the second structural layer may be formed in the same layer as the light-emitting layer in the display structure layer 12. As such, a manufacturing process of the dam structure 13 and a manufacturing process of the display structure layer 12 may share two patterning processes.

At 2012, the organic encapsulation layer (e.g., 151) may be formed on the flexible substrate (e.g., 11). In some examples, the organic encapsulation layer 151, or the encapsulation layer (e.g., 15), may cover the display area (e.g., D), at least a portion of the non-display area (e.g., C), and the one or more grooves (e.g., 14). In one example, the organic encapsulation layer 151, or the encapsulation layer 15, may cover the one or more first grooves (e.g., 141) and the one or more second grooves (e.g., 142) on the side of the display structure layer (e.g., 12) away from the flexible substrate 11.

In some examples, each of the first inorganic encapsulation layer (e.g., 152) and the second inorganic encapsulation layer (e.g., 153) may be further formed on the side of the display structure layer (e.g., 12) away from the flexible substrate (e.g., 11). In some examples, the encapsulation layer (e.g., 15) may be formed from a sequential covering, or stacking, of the first inorganic encapsulation layer 152, the organic encapsulation layer (e.g., 151), and the second inorganic encapsulation layer 153. For example, a chemical vapor deposition (CVD) process may be used to deposit the first inorganic encapsulation layer 152 on the side of the second flat layer (e.g., 102) away from the flexible substrate 11. The organic encapsulation layer 151 may then be formed by an inkjet printing (IJP) process. The second inorganic encapsulation layer 153 may then be formed using a CVD process.

While forming the organic encapsulation layer (e.g., 151), the one or more first grooves (e.g., 141) may slow down the flow rate of an organic material, such as a polyimide material, so that the organic material may be uniformly distributed in various regions of the non-display area (e.g., C). Further, while forming the organic encapsulation layer 151, the one or more second grooves (e.g., 142) may quickly slow down the flow rate of the organic material, thereby preventing the organic material from overflowing the dam structure (e.g., 13) which defines the edge of the organic encapsulation layer 151.

At 2014, the touch line (e.g., 223) may be formed on the side of the organic encapsulation layer (e.g., 151) away from the flexible substrate (e.g., 11).

At 2016, the rigid substrate may be peeled off.

Optionally, in some examples wherein the one or more grooves (e.g., 14) may include only one or more first grooves (e.g., 141), and the one or more first grooves 141 are located on the flat layer (e.g., 16), 2002 may alternatively include forming the flexible substrate (e.g., 11) on the rigid substrate (e.g., 23), wherein the flexible substrate 11 may have a completely plate-like structure. Further, 2012 may alternatively include forming the organic encapsulation layer (e.g., 151) covering the one or more first grooves 141 on the side of the display structure layer (e.g., 12) away from the flexible substrate 11. Each other method step accordingly remains the same.

Optionally, in some examples wherein the one or more grooves (e.g., 14) are located on the flexible substrate (e.g., 11), 2002 may alternatively include forming the flexible substrate 11 having the one or more grooves 14 on the rigid substrate (e.g., 23). Further, 2006 may be omitted. Further, 2012 may alternatively include forming the organic encapsulation layer (e.g., 151) on the side of the display structure layer (e.g., 12) away from the flexible substrate 11. Each other method step accordingly remains the same.

It will be appreciated that, in the manufacturing processes and methods detailed hereinabove with reference to FIGS. 18-24, a number, a depth, or a type (e.g., discontinuous, non-interrupted) of the one or more grooves (e.g., 14) are set based on actual production requirements, and are not to be limited by any embodiment of the present disclosure.

It will be appreciated that each of the first wire layer, the second wire layer (e.g., 18), and the third wire layer (e.g., 101) may be other types of wire layers than those described in the present disclosure. Further, any set of one or more layers may be disposed in any sequential arrangement with respect to the any other set of one or more layers. As such, the embodiments of the present disclosure are only examples and are not limited thereto.

It will be apparent to those skilled in the art that the specific steps of the manufacturing processes and methods detailed hereinabove with reference to FIGS. 18-24 may refer to corresponding processes/elements in the device embodiments for convenience and brevity of description, details of which are not described herein again.

In summary, the manufacturing method of the display panel (e.g., 21) includes forming the flexible substrate (e.g., 11) having the display area (e.g., D) and the non-display area (e.g., C), and the one or more grooves (e.g., 14) disposed on the non-display area C between the display area D and the dam structure (e.g., 13). When the organic encapsulation layer (e.g., 151) is formed, the one or more grooves 14 can drain organic material, thereby increasing the flatness of the organic encapsulation layer 151, which further increases the flatness (e.g., 155) and reduces the slope angle (e.g., 154) of the edge of the encapsulation layer (e.g., 15) as a whole.

Further, via such draining by the one or more grooves 14, the contact area of the organic encapsulation layer 151 with a substrate disposed thereon can be increased, thereby reducing peeling between the organic encapsulation layer 151 and said substrate, and improving the overall quality of the display panel 21.

In this way, a display panel is provided, which includes a flexible substrate having a display area and a non-display area, where an annular dam structure is located in the non-display area and disposed around the display area, and one or more grooves are disposed on the non-display area between the display area and the annular dam structure, which may drain organic material during formation of an organic encapsulation layer. The technical effect of the draining via the annular dam structure and the groove is that a flatness of the organic encapsulation layer may be improved and peeling between the organic encapsulation layer and a substrate on which it is disposed may be reduced.

In one example, a display panel, comprising: a flexible substrate having a display area and a non-display area; a dam structure, located in the non-display area and disposed around the display area; one or more grooves disposed on the non-display area between the display area and the dam structure; and an organic encapsulation layer covering the display area, at least a portion of the non-display area, and the one or more grooves.

Optionally, the display panel, wherein the one or more grooves include a plurality of grooves, where each groove of the plurality of grooves are spaced apart from each adjacent groove of the plurality of grooves.

Optionally, the display panel, wherein the display panel further comprises: a flat layer disposed on the flexible substrate, the flat layer covering at least the display area; wherein the plurality of grooves includes one or both of one or more first grooves and one or more second grooves; the one or more first grooves are located between the display area and an edge of the flat layer; and the one or more second grooves are located in a region between the edge of the flat layer and the dam structure.

Optionally, the display panel, wherein the one or more first grooves are located on the flat layer or the flexible substrate.

Optionally, the display panel, wherein the one or more second grooves are located on the flexible substrate.

Optionally, the display panel, wherein the one or more first grooves include a plurality of first grooves that gradually decrease in depth in a direction away from the display area.

Optionally, the display panel, wherein the one or more second grooves include a plurality of second grooves that gradually decrease in depth in the direction away from the display area.

Optionally, the display panel, wherein the flexible substrate includes a first organic layer, a first inorganic layer, a second organic layer, and a second inorganic layer that are sequentially stacked; and one or both of the one or more first grooves and the one or more second grooves is located on a side of the second organic layer adjacent to the second inorganic layer.

Optionally, the display panel, wherein a width of an opening of each groove of the one or more grooves is greater than a width of a bottom of said groove.

Optionally, the display panel, wherein the one or more grooves include one or both of a discontinuous groove and a non-interrupted groove.

Optionally, a display device, comprising: the display panel; and a transparent cover; wherein the transparent cover is in face-sharing contact with the display panel.

Optionally, the display device, wherein the transparent cover comprises a transparent substrate, a polarizer, and a touch line, where the polarizer and the touch line are disposed on the transparent substrate; and a side of the transparent substrate on which the polarizer and the touch line are disposed is in face-sharing contact with the display panel.

Optionally, the display device, wherein the transparent cover comprises a transparent substrate, where a polarizer is disposed on the transparent substrate; the display panel further comprises a touch line disposed on the organic encapsulation layer; and a side of the transparent substrate on which the polarizer is disposed is in face-sharing contact with the display panel.

Optionally, the display device, wherein the transparent cover is a 3D cover.

In another example, a method of manufacturing a display panel, the method comprising: forming a flexible substrate on a rigid substrate, the flexible substrate having a display area and a non-display area; forming a dam structure in the non-display area and around the display area; forming one or more grooves on the non-display area between the display area and the dam structure; forming an organic encapsulation layer on the flexible substrate; and peeling off the rigid substrate; wherein the organic encapsulation layer covers the display area, at least a portion of the non-display area, and the one or more grooves.

Optionally, the method, wherein the method further comprises: forming a flat layer on the flexible substrate; and forming a display structure layer on the display area on a side of the flat layer away from the flexible substrate; wherein the flat layer covers at least the display area; the one or more grooves comprise one or both of one or more first grooves and one or more second grooves; the one or more first grooves are located between the display area and an edge of the flat layer; and the one or more second grooves are located in a region between the edge of the flat layer and the dam structure.

Optionally, the method, wherein the one or more first grooves are formed on the flat layer or the flexible substrate.

Optionally, the method, wherein the one or more second grooves are formed on the flexible substrate.

Optionally, the method, wherein the one or more first grooves include a plurality of first grooves that gradually decrease in depth in a direction away from the display area.

Optionally, the method, wherein the one or more second grooves include a plurality of second grooves that gradually decrease in depth in the direction away from the display area.

Optionally, the method, wherein the forming the flexible substrate on the rigid substrate comprises: sequentially forming a first organic layer, a first inorganic layer, and a second organic layer on the rigid substrate; and forming a second inorganic layer conformally on a side of the second organic layer away from the first inorganic layer; wherein one or both of the one or more first grooves and the one or more second grooves are located on the second organic layer.

Optionally, the method, wherein the method further comprises forming a touch line on a side of the organic encapsulation layer away from the flexible substrate.

Optionally, the method, wherein the forming the dam structure and the forming the display structure layer share at least one patterning process.

Optionally, the method, wherein the one or more grooves include one or both of a discontinuous groove and a non-interrupted groove; and a width of an opening of each groove of the one or more grooves is greater than a width of a bottom of said groove.

FIGS. 1-17 and 21-24 show example configurations with relative positioning of the various components described herein. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space there-between and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example. Elements may be depicted approximately to scale, and should not be limited to the relative sizes shown in the figures.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

It is to be understood that the above embodiments are merely exemplary embodiments employed to explain the principles of the inventive concepts, but the inventive concepts are not limited thereto. Various modifications and improvements can be made by those skilled in the art without departing from the spirit and scope of the disclosure, and such modifications and improvements are also considered to be within the scope of the disclosure.

The invention claimed is:

1. A display panel, comprising:
a flexible substrate having a display area and a non-display area;

a dam structure, located in the non-display area and disposed around the display area;

a plurality of grooves disposed on the non-display area between the display area and the dam structure, wherein each groove of the plurality of grooves is spaced apart from each adjacent groove of the plurality of grooves, and the plurality of grooves includes one or more second grooves;

an organic encapsulation layer covering the display area, at least a portion of the non-display area, and the one or more grooves; and a flat layer disposed on the flexible substrate, the flat layer covering at least the display area, wherein the one or more second grooves are located in a region between the edge of the flat layer and the dam structure.

2. The display panel of claim 1, wherein the plurality of grooves includes one or more first grooves.

3. The display panel of claim 2, wherein the one or more first grooves are located between the display area and an edge of the flat layer.

4. The display panel of claim 2, wherein the one or more first grooves are located on the flat layer or the flexible substrate.

5. The display panel of claim 1, wherein the one or more second grooves are located on the flexible substrate.

6. The display panel of claim 2, wherein the one or more first grooves include a plurality of first grooves that decrease in depth in a direction away from the display area.

7. The display panel of claim 1, wherein the one or more second grooves include a plurality of second grooves that decrease in depth in the direction away from the display area.

8. The display panel of claim 4, wherein the flexible substrate includes a first organic layer, a first inorganic layer, a second organic layer, and a second inorganic layer that are sequentially stacked; and one or both of the one or more first grooves and the one or more second grooves are located on a side of the second organic layer adjacent to the second inorganic layer.

9. The display panel of claim 1, wherein a width of an opening of each groove of the plurality of grooves is greater than a width of a bottom of said groove.

10. The display panel of claim 1, wherein the plurality of grooves includes one or both of a discontinuous groove and a non-interrupted groove.

11. A display device, comprising:
a display panel, comprising:
a flexible substrate having a display area and a non-display area;
a dam structure, located in the non-display area and disposed around the display area;
a plurality of grooves disposed on the non-display area between the display area and the dam structure, wherein each groove of the plurality of grooves is spaced apart from each adjacent groove of the plurality of grooves, and the plurality of grooves includes one or more first grooves; and
an organic encapsulation layer covering the display area, at least a portion of the non-display area, and the plurality of grooves;
a transparent cover; wherein
the transparent cover is in face-sharing contact with the display panel; and
a flat layer disposed on the flexible substrate, the flat layer covering at least the display area, wherein the one or more first grooves are located between the display area and an edge of the flat layer.

12. The display device of claim 11, wherein
the transparent cover comprises a transparent substrate, a polarizer, and a touch line, where the polarizer and the touch line are disposed on the transparent substrate; and
a side of the transparent substrate on which the polarizer and the touch line are disposed is in face-sharing contact with the display panel.

13. The display device of claim 11, wherein
the transparent cover comprises a transparent substrate, where a polarizer is disposed on the transparent substrate;
the display panel further comprises a touch line disposed on the organic encapsulation layer; and
a side of the transparent substrate on which the polarizer is disposed is in face-sharing contact with the display panel.

14. The display device of claim 11, wherein the plurality of grooves includes one or more second grooves located in a region between the edge of the flat layer and the dam structure.

15. A method of manufacturing a display panel, the method comprising:
forming a flexible substrate on a rigid substrate, the flexible substrate having a display area and a non-display area;
forming a dam structure in the non-display area and around the display area;
forming one or more grooves on the non-display area between the display area and the dam structure;
forming an organic encapsulation layer on the flexible substrate;
peeling off the rigid substrate; wherein
the organic encapsulation layer covers the display area, at least a portion of the non-display area, and the one or more grooves;
forming a flat layer on the flexible substrate; and
forming a display structure layer on the display area on a side of the flat layer away from the flexible substrate; wherein
the flat layer covers at least the display area;
the one or more grooves comprise one or more first grooves, and the one or more first grooves are located between the display area and an edge of the flat layer.

16. The method of claim 15, wherein the one or more first grooves are formed on the flat layer or the flexible substrate.

17. The method of claim 15, wherein the plurality of grooves includes one or more second grooves located in a region between the edge of the flat layer and the dam structure, and the one or more second grooves are formed on the flexible substrate.

18. The method of claim 15, wherein the one or more first grooves include a plurality of first grooves that decrease in depth in a direction away from the display area.

19. The method of claim 15, wherein the plurality of grooves includes one or more second grooves, and the one or more second grooves include a plurality of second grooves that decrease in depth in the direction away from the display area.

20. The method of claim 15, wherein
the one or more grooves include one or both of a discontinuous groove and a non-interrupted groove; and a width of an opening of each groove of the one or more grooves is greater than a width of a bottom of said groove.

\* \* \* \* \*